United States Patent
Nakamura et al.

(10) Patent No.: US 12,247,898 B2
(45) Date of Patent: Mar. 11, 2025

(54) IN-VEHICLE EQUIPMENT AND DETERIORATION DETERMINING METHOD

(71) Applicant: Mitsubishi Electric Corporation, Tokyo (JP)

(72) Inventors: Yuya Nakamura, Tokyo (JP); Taichi Yoshida, Tokyo (JP); Tomoki Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 304 days.

(21) Appl. No.: 17/923,702

(22) PCT Filed: Jul. 2, 2020

(86) PCT No.: PCT/JP2020/026016
§ 371 (c)(1),
(2) Date: Nov. 7, 2022

(87) PCT Pub. No.: WO2022/003900
PCT Pub. Date: Jan. 6, 2022

(65) Prior Publication Data
US 2023/0204450 A1    Jun. 29, 2023

(51) Int. Cl.
*G01M 3/24* (2006.01)
(52) U.S. Cl.
CPC ...................... *G01M 3/24* (2013.01)
(58) Field of Classification Search
CPC ....................................... G01M 3/24
USPC ......................................... 73/592
See application file for complete search history.

(56) References Cited

U.S. PATENT DOCUMENTS

2008/0006089 A1*  1/2008  Adnan ............... G01M 3/24
                                              417/63
2020/0245480 A1*  7/2020  Mauger ............. H05K 5/0073

FOREIGN PATENT DOCUMENTS

| JP | H07159231 A | 6/1995 |
| JP | 2013082302 A | 5/2013 |
| JP | 2014008802 A | 1/2014 |
| JP | 2015039918 A | 3/2015 |

OTHER PUBLICATIONS

Office Action issued in corresponding Indian Patent Application No. 202227066117, mailed on Mar. 1, 2023, 6 pages.
International Search Report (PCT/ISA/210) with translation and Written Opinion (PCT/ISA/237) mailed on Sep. 1, 2020, by the Japan Patent Office as the International Searching Authority for International Application No. PCT/JP2020/026016. (8 pages).

* cited by examiner

*Primary Examiner* — Walter L Lindsay, Jr.
*Assistant Examiner* — Philip T Fadul
(74) *Attorney, Agent, or Firm* — BUCHANAN, INGERSOLL & ROONEY PC

(57) ABSTRACT

An in-vehicle device includes a housing having an opening, an openable and closable cover disposed over the opening, a sealing member disposed around the opening such that the sealing member is held between the housing and the cover when the cover is closed, at least one first vibration sensor to measure mechanical vibration of the cover, and a degradation determiner to determine whether any degradation occurs in the sealing member. The degradation determiner determines whether any degradation occurs in the sealing member on the basis of the mechanical vibration measured by the at least one first vibration sensor while the cover is closed.

18 Claims, 20 Drawing Sheets

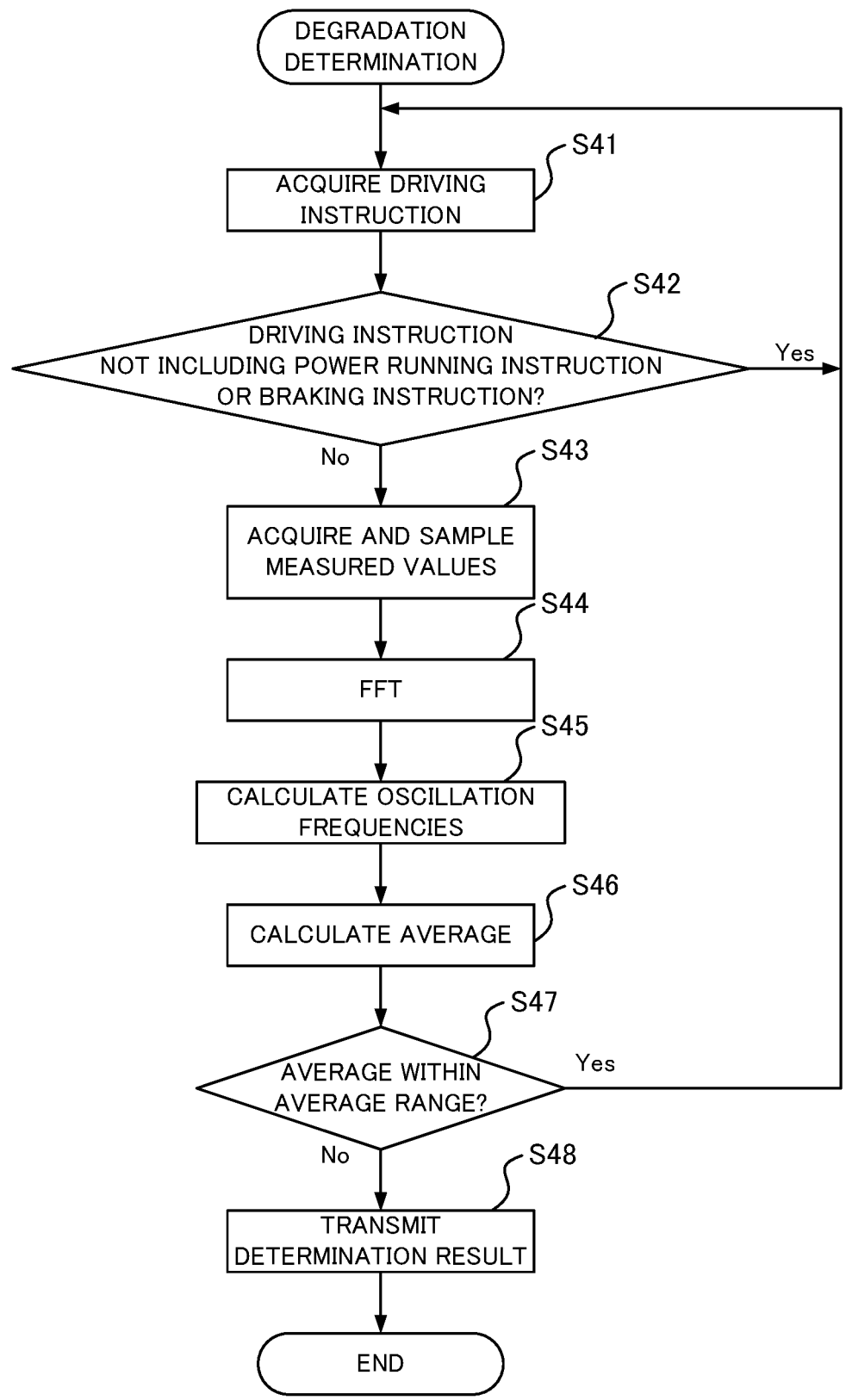

IN-VEHICLE EQUIPMENT AND DETERIORATION DETERMINING METHOD

TECHNICAL FIELD

The present disclosure relates to an in-vehicle device and a method of determining degradation.

BACKGROUND ART

Housings of in-vehicle devices installed in vehicles accommodate electronic equipment including power converters, circuit breakers, and transformers, for example. These housings are provided with openings that allow for inspection and maintenance of the internal electronic equipment. The openings are covered with covers that can be opened and closed so as to inhibit contaminants, such as dust and water drops, from entering the housings. A typical example of these types of in-vehicle devices is disclosed in Patent Literature 1.

CITATION LIST

Patent Literature

Patent Literature 1: Unexamined Japanese Patent Application Publication No. 2014-8802

SUMMARY OF INVENTION

Technical Problem

The control device for a railway vehicle disclosed in Patent Literature 1, which is an example of the in-vehicle device, includes a housing that accommodates an inverter unit and a control unit, for example. The housing has an opening for maintenance covered with an attachable and detachable cover. The opening may be provided with a sealing member therearound in order to improve the dust resistance and waterproofness of the in-vehicle device. The sealing member is held between the cover and the housing while the cover is closed, and thereby inhibits contaminants, such as dust and water drops, from entering the housing through the opening. Unfortunately, when the resilience of the sealing member decreases due to degradation of the sealing member, for example, a gap is formed between the sealing member and the cover or the housing while the cover is closed, thereby impairing the waterproofness and dust resistance of the in-vehicle device.

An objective of the present disclosure, which has been accomplished in view of the above situations, is to provide an in-vehicle device and a method of determining degradation that can determine whether any degradation occurs in a sealing member.

Solution to Problem

In order to achieve the above objective, an in-vehicle device according to an aspect of the present disclosure is installed in a vehicle, and includes a housing, a cover, a sealing member, at least one first vibration sensor, and a degradation determiner. The housing has an opening. The cover is disposed over the opening and is openable and closable. The sealing member is disposed around the opening such that the sealing member is held between the housing and the cover when the cover is closed. The at least one first vibration sensor measures mechanical vibration of the cover. The degradation determiner determines, based on the mechanical vibration measured by the at least one first vibration sensor while the cover is closed, whether any degradation occurs in the sealing member.

Advantageous Effects of Invention

The in-vehicle device according to an aspect of the present disclosure can determine whether any degradation occurs in the sealing member, on the basis of the mechanical vibration of the cover measured by the at least one first vibration sensor.

BRIEF DESCRIPTION OF DRAWINGS

FIG. 20 is a flowchart illustrating exemplary steps of a degradation determining process executed by the degradation determiner according to Embodiment 4.

DESCRIPTION OF EMBODIMENTS

An in-vehicle device and a method of determining degradation according to embodiments of the present disclosure are described in detail below with reference to the accom-

Embodiment 1

Figure 1:
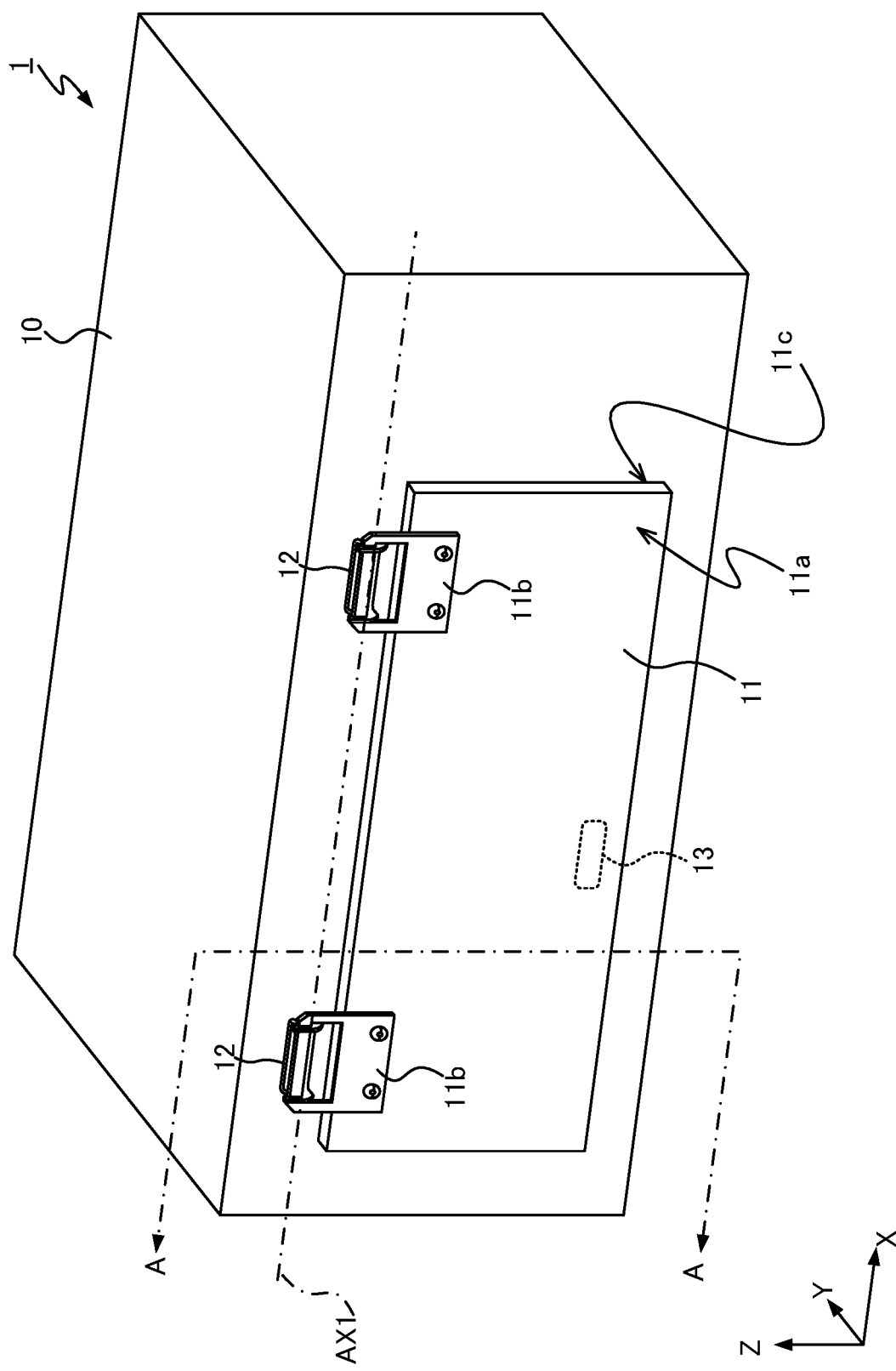
FIG. 1 is a perspective view of an in-vehicle device according to Embodiment 1.

A typical example of an in-vehicle device installed in a vehicle is a control device for a railway vehicle including a power converter, a circuit breaker, and a transformer, for example. An in-vehicle device 1 according to Embodiment 1 is described below focusing on an exemplary control device installed under the floor of a railway vehicle. As illustrated in FIG. 1, the in-vehicle device 1 includes a housing 10 to be fixed under the floor of the railway vehicle with fitting members, which are not illustrated, an openable and closable cover 11, and two support members 12 to support the cover 11.

Figure 2:
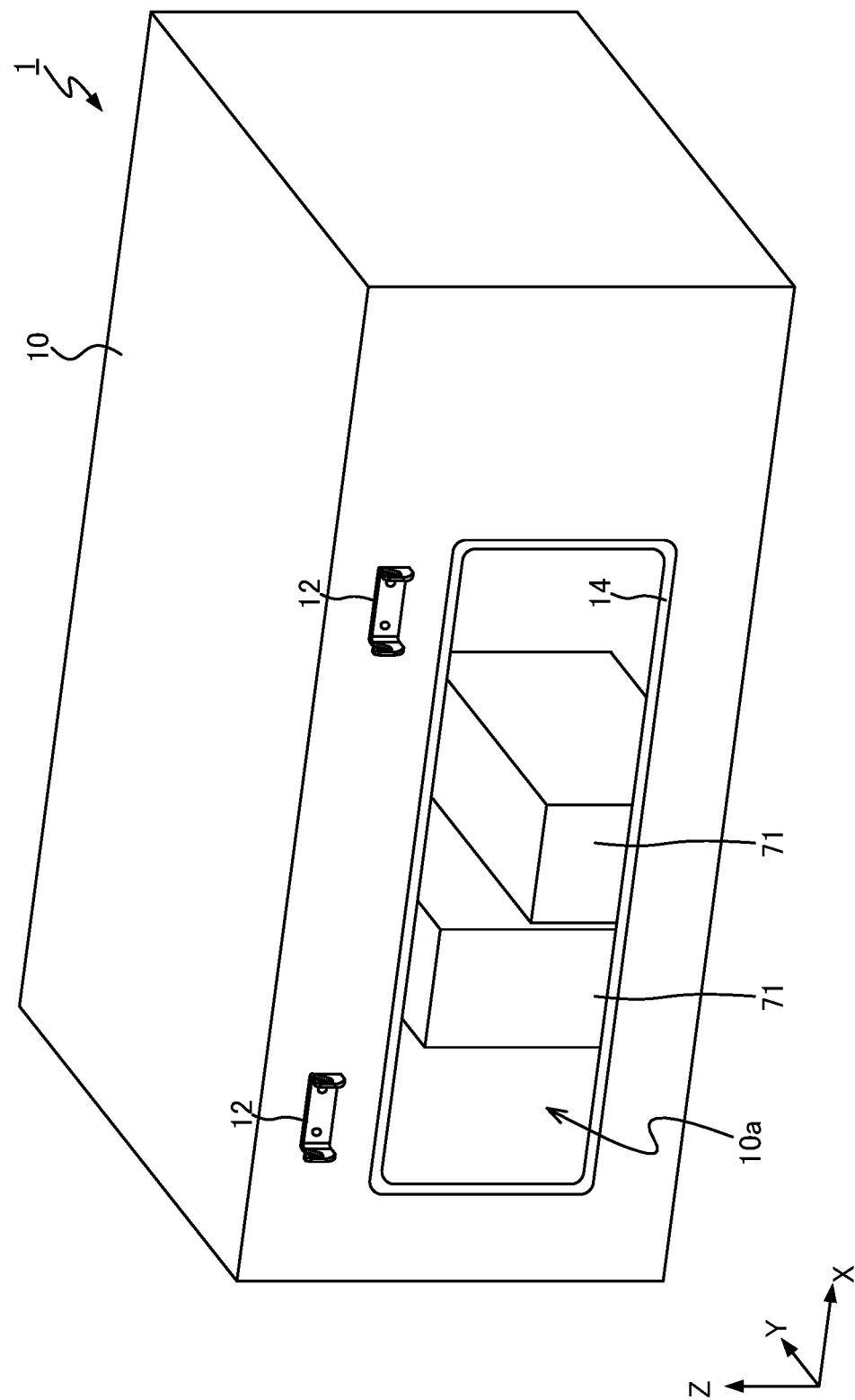
FIG. 2 is another perspective view of the in-vehicle device according to Embodiment 1.

The in-vehicle device 1 also includes a first vibration sensor 13 to measure mechanical vibration of the cover 11. As illustrated in FIG. 2, which is a perspective view of the in-vehicle device 1 after removal of the cover 11, the housing 10 is provided with an opening 10a. As illustrated in FIG. 2, the in-vehicle device 1 further includes a sealing member 14 disposed around the opening 10a such that the sealing member 14 is held between the housing 10 and the cover 11 when the cover 11 is closed.

In FIGS. 1 and 2, the Z axis indicates the vertical direction, the Y axis indicates the direction in which the opening 10a extends through the housing 10, and the X axis extends in the horizontal direction along the surface of the housing 10 provided with the opening 10a. The X, Y, and Z axes are orthogonal to each other.

Figure 3:
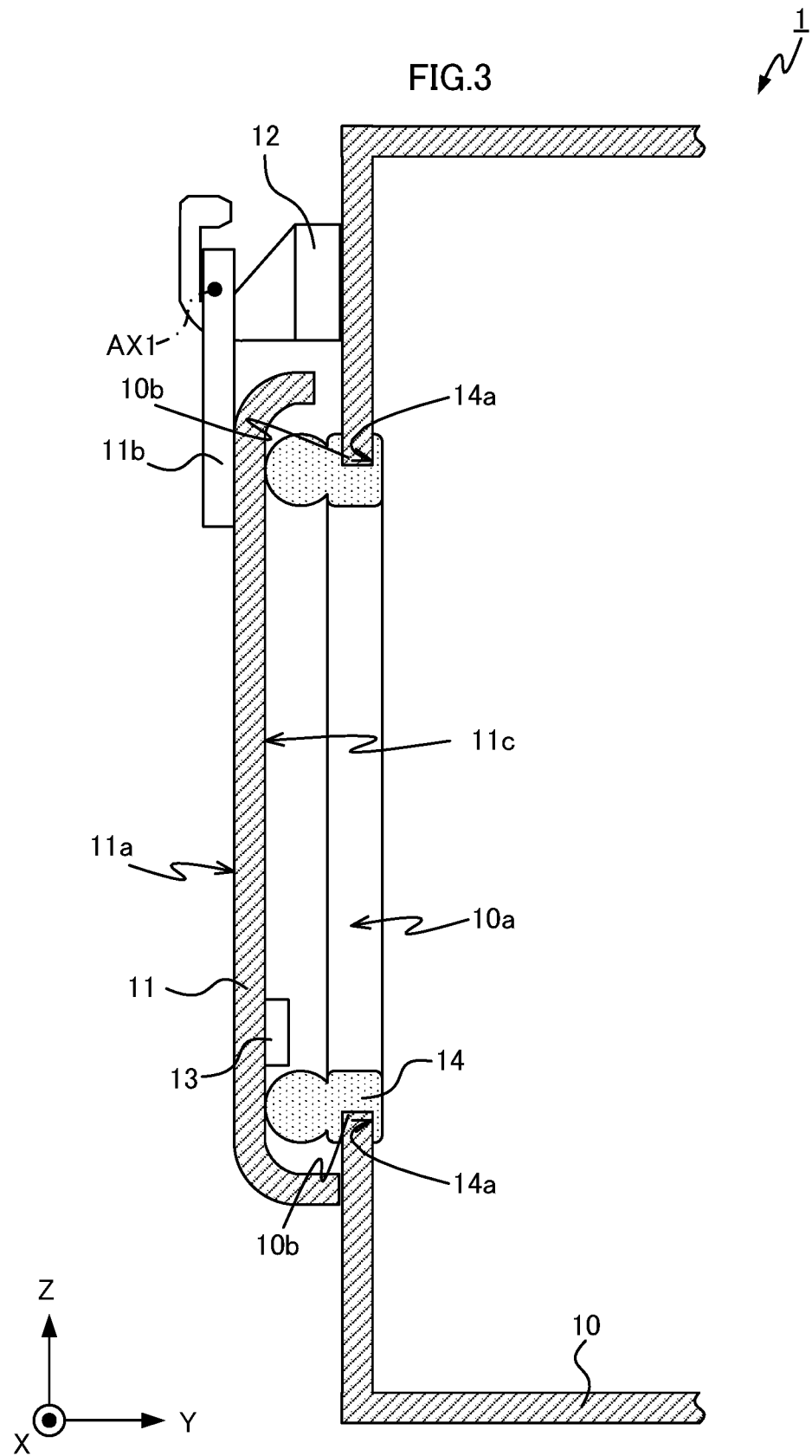
FIG. 3 is a partial sectional view of the in-vehicle device according to Embodiment 1 taken along the line A-A of FIG. 1.

In the case where no degradation with age occurs in the sealing member 14, the sealing member 14 held and pressed between the housing 10 and the cover 11 while the cover 11 is closed has a sufficiently high resilience. As illustrated in FIG. 3, which is a partial sectional view taken along the line A-A of FIG. 1, this configuration can prevent a gap from being formed between the cover 11 and the housing 10. The structure with no gap can inhibit contaminants, such as dust and water drops, from entering the housing 10 through the opening 10a. FIG. 3 does not illustrate electronic equipment 71.

Unfortunately, when the resilience of the sealing member 14 decreases due to degradation with age, for example, a gap is formed between the sealing member 14 and the cover 11 or the housing 10 while the cover 11 is closed. This gap may allow contaminants, such as dust and water drops, to enter the housing 10 through the opening 10a.

When a gap is formed between the sealing member 14 and the cover 11 or the housing 10, the mechanical vibration of the cover 11 during running of the vehicle becomes bigger than that in the case of no gap between the sealing member 14 and the cover 11 or the housing 10. In view of these facts, the in-vehicle device 1 further includes a degradation determiner 31, which is described below, to determine whether any degradation occurs in the sealing member 14 on the basis of the mechanical vibration measured by the first vibration sensor 13 while the cover 11 is closed. The in-vehicle device 1 can therefore determine whether any degradation occurs in the sealing member 14.

The individual components of the in-vehicle device 1 are described in detail below.

As illustrated in FIG. 2, the housing 10 accommodates the electronic equipment 71 including a power converter, a circuit breaker, and a transformer, for example. The housing has the opening 10a on a side surface of the housing 10. This opening 10a allows for maintenance of the electronic equipment 71 accommodated in the housing 10.

As illustrated in FIGS. 1 and 2, the cover 11 is disposed over the opening 10a and the circumference of the opening 10a. The cover 11 has an outer surface 11a that faces the outside of the housing 10, and the outer surface 11a is provided with two engaging members 11b fixed with fastening members. Each of the engaging members 11b has a through hole. The engaging members 11b engage with the respective support members 12 while the support members 12 are inserted in the respective through holes of the engaging members 11b. The engaging members 11b are rotatable about a rotational axis AX1 while the support members 12 are inserted in the respective through holes. The cover 11 is thus supported by the two support members 12 so as to be rotatable about the rotational axis AX1, and openable and closable by rotating about the rotational axis AX1. In FIG. 1, the rotational axis AX1 is represented by the dashed and single-dotted line. The rotational axis AX1 extends in the X-axis direction, that is, the horizontal direction.

Figure 4:
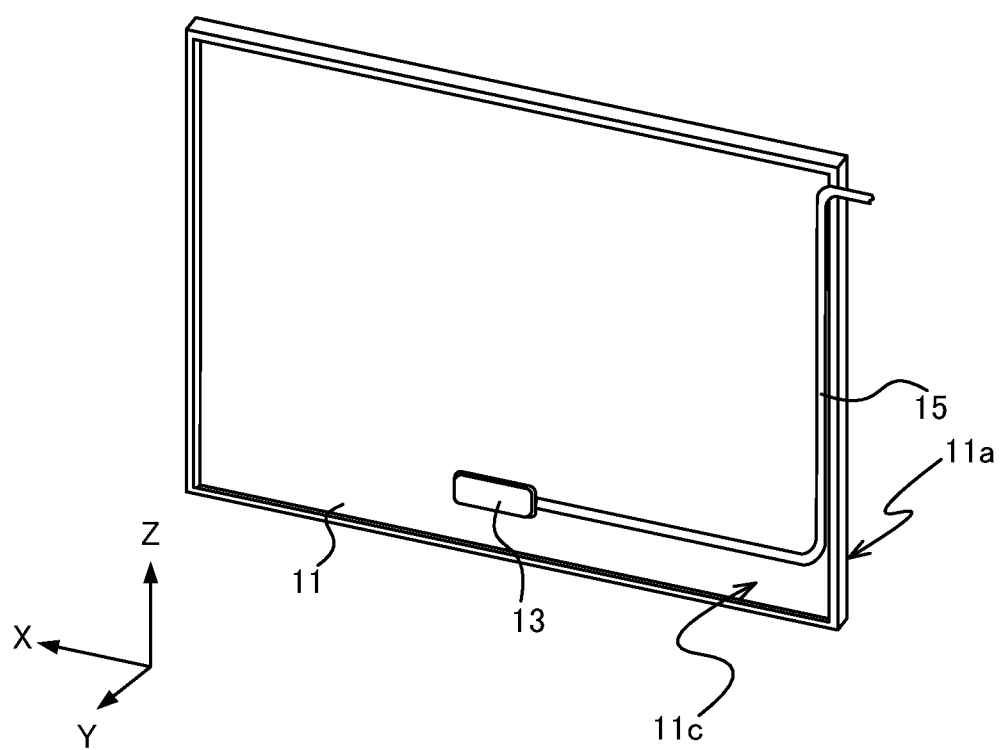
FIG. 4 is a perspective view of a cover according to Embodiment 1.

The cover 11 has an inner surface 11c that faces the inside of the housing 10, and the inner surface 11c is provided with the first vibration sensor 13, as illustrated in FIG. 4. FIG. 4 illustrates the cover 11 as viewed from the inside of the housing 10 while the cover 11 is closed.

As illustrated in FIGS. 1 and 2, the two support members 12 are fixed with fastening members on the surface of the housing 10 provided with the opening 10a. Specifically, the two support members 12 are arranged in the X-axis direction at positions above the opening 10a in the vertical direction. Each of the support members 12 has protrusions extending in a direction away from the housing 10, and each of the protrusions has a notch. The protrusions of the support member 12 are inserted in each of the through holes of the engaging members 11b and the engaging member 11b engages with the notches of the support member 12, so that the two support members 12 support the cover 11 such that the cover 11 is rotatable about the rotational axis AX1.

The first vibration sensor 13 is mounted on the cover 11 and measures mechanical vibration of the cover 11. A typical example of the first vibration sensor 13 is a contact acceleration sensor.

The vibration of the cover 11 generated during running of the vehicle varies depending on the position in the cover 11. Specifically, the vibration of the cover 11 is bigger at a position more distant from the engaging members 11b supported by the support members 12. The first vibration sensor 13 is thus preferably disposed at a position at least a first distance away from each of the support members 12 while the cover 11 is closed. The first distance is defined in view of the parameters, such as the size of the cover 11 and the positions of the support members 12. For example, the first distance is defined to be equal to the half of the length of the cover 11 in the transverse direction.

More preferably, the first vibration sensor 13 is mounted on the inner surface 11c of the cover 11 at the position so as to maximize the distance from the support members 12 while the cover 11 is closed, among the mountable positions in the inner surface 11c of the cover 11. In the example illustrated in FIG. 4, the first vibration sensor 13 is mounted on the inner surface 11c of the cover 11 at the position in the center in the X-axis direction in the vertically bottom portion.

The first vibration sensor 13 is connected to a cable 15. The first vibration sensor 13 is fed with electric power and transmits measured values to the degradation determiner 31 via the cable 15. The first vibration sensor 13 is preferably fed with electric power from the electronic equipment 71.

The sealing member 14 has a groove 14a to engage with an edge 10b of the opening 10a, as illustrated in FIG. 3. The engagement of the groove 14a of the sealing member 14 with the edge 10b of the opening 10a allows the sealing member 14 to be attached to the housing 10 while being disposed around the opening 10a. When the cover 11 is closed, the sealing member 14 is held between the housing 10 and the cover 11. The sealing member 14 is made of a material resilient to pressure, such as synthetic rubber or resin, for example.

Figure 5:
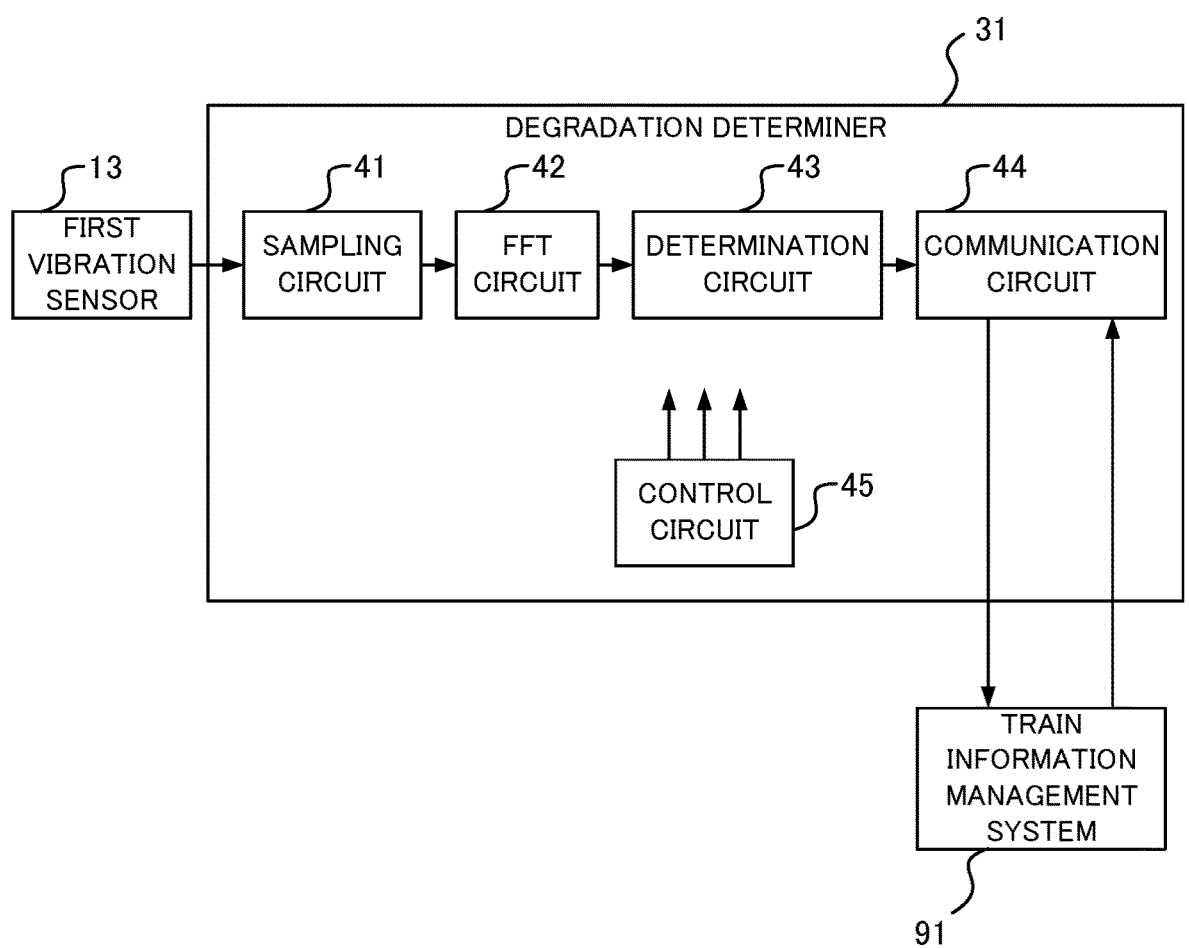
FIG. 5 is a block diagram illustrating a degradation determiner according to Embodiment 1.

The degradation determiner 31 is accommodated in the housing 10, and determines whether any degradation occurs in the sealing member 14 on the basis of the oscillation frequency of the mechanical vibration of the cover 11. In detail, as illustrated in FIG. 5, the degradation determiner 31 includes a sampling circuit 41 to sample values measured by the first vibration sensor 13, an FFT circuit 42 to generate a piece of frequency-domain data from the sampled values measured by the first vibration sensor 13, a determination circuit 43 to calculate an oscillation frequency from the piece of frequency-domain data and determine whether the calculated oscillation frequency falls within a predetermined frequency range, a communication circuit 44 to transmit a result of determination performed by the determination circuit 43 to a train information management system 91, and a control circuit 45 to control the individual components of the degradation determiner 31.

The individual components of the degradation determiner 31 are described in detail below.

The sampling circuit 41 samples a value measured by the first vibration sensor 13 every predetermined sampling period, and outputs the sampled values measured by the first vibration sensor 13 to the FFT circuit 42.

The FFT circuit 42 executes fast Fourier transform (FFT) on the values measured by the first vibration sensor 13 and sampled by the sampling circuit 41 and thereby generates a piece of frequency-domain data. The FFT circuit 42 then outputs the piece of frequency-domain data to the determination circuit 43.

The determination circuit 43 calculates an oscillation frequency from the peak value of the piece of frequency-domain data. The determination circuit 43 then determines whether the calculated oscillation frequency falls within a predetermined frequency range. For example, the determination circuit 43 includes a peak detecting circuit to detect the peak value, and a comparator to compare the peak value detected by the peak detecting circuit with each of the upper limit and the lower limit of the frequency range. When the oscillation frequency falls within the predetermined frequency range, this situation can be deemed that no degradation occurs in the sealing member 14. In contrast, when the oscillation frequency does not fall within the predetermined frequency range, this situation implies big vibration of the cover 11 and can be deemed that any degradation occurs in the sealing member 14.

The frequency range is defined on the basis of possible values of the oscillation frequency calculated from the values measured by the first vibration sensor 13, in the case where the cover 11 is considered to be certainly closed in view of the parameters, such as the air tightness necessary for the in-vehicle device 1, the material of the sealing member 14, and the materials of the housing 10 and the cover 11. In detail, possible values of the oscillation frequency calculated from the values measured by the first vibration sensor 13 in the case where the cover 11 is considered to be certainly closed are calculated on the basis of simulations or test runs, and a value range encompassing the calculated possible values of the oscillation frequency is applied as the frequency range.

When the determination circuit 43 determines that the oscillation frequency does not fall within the predetermined range, the communication circuit 44 transmits a determination result indicating that any degradation occurs in the sealing member 14 to the train information management system 91. The train information management system 91 is an in-vehicle system to control devices, such as a power conversion apparatus, air conditioners, and lighting equipment. When the train information management system 91 receives the determination result indicating that any degradation occurs in the sealing member 14 from the degradation determiner 31, the train information management system 91 causes a display device of a cab to display the determination result or transmits the determination result to a monitoring system installed in a direction center.

The control circuit 45 controls the initiation, termination, and synchronization of processes of the individual components of the degradation determiner 31, that is, the sampling circuit 41, the FFT circuit 42, the determination circuit 43, and the communication circuit 44.

Figure 6:
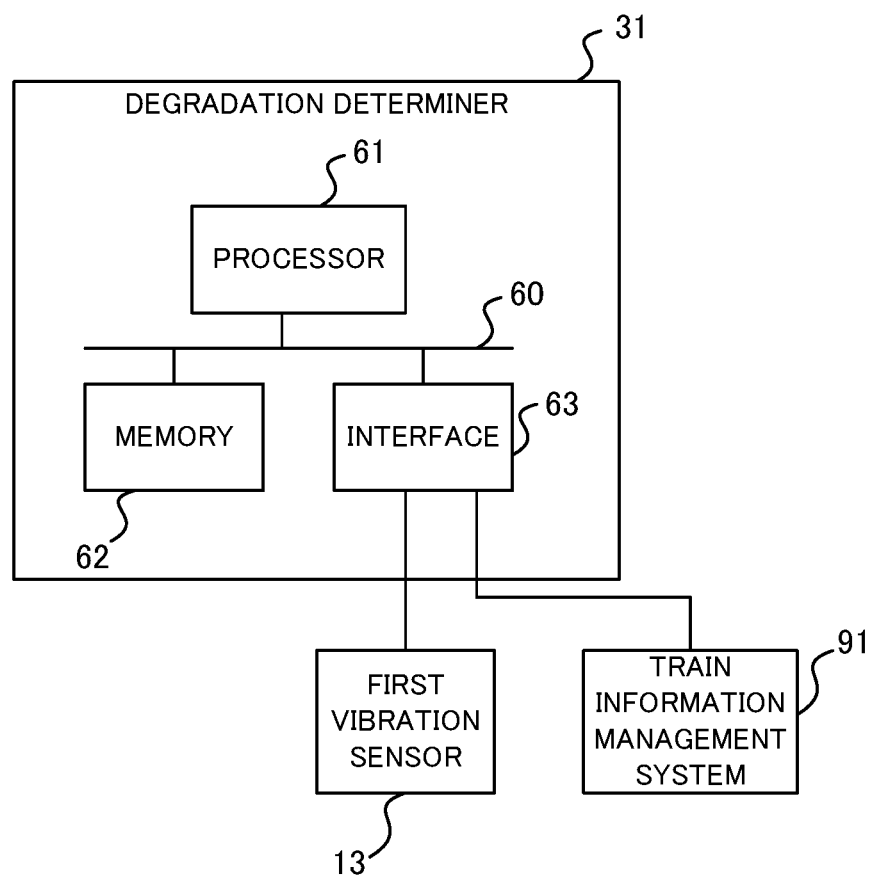
FIG. 6 illustrates an exemplary hardware configuration of the degradation determiner according to Embodiment 1.

As illustrated in FIG. 6, the degradation determiner 31 is achieved by a processor 61, a memory 62, and an interface 63. The processor 61, the memory 62, and the interface 63 are connected to each other via buses 60. The processor 61 is connected to each of the first vibration sensor 13 and the train information management system 91 via the buses 60 and the interface 63. The process of determining the occurrence of degradation executed by the degradation determiner 31 is achieved by the processor 61 executing a program stored in the memory 62.

The interface 63 serves to connect the degradation determiner 31 to each of the first vibration sensor 13 and the train information management system 91 and establish connection therebetween. The interface 63 is pursuant to multiple types of interface standards as necessary. Although the degradation determiner 31 includes a single processor 61 and a single memory 62 in the example illustrated in FIG. 6, the degradation determiner 31 may include multiple processors 61 and multiple memories 62.

The following description is directed to a degradation determining process executed by the degradation determiner 31 of the in-vehicle device 1 having the above-described configuration.

Figure 7:
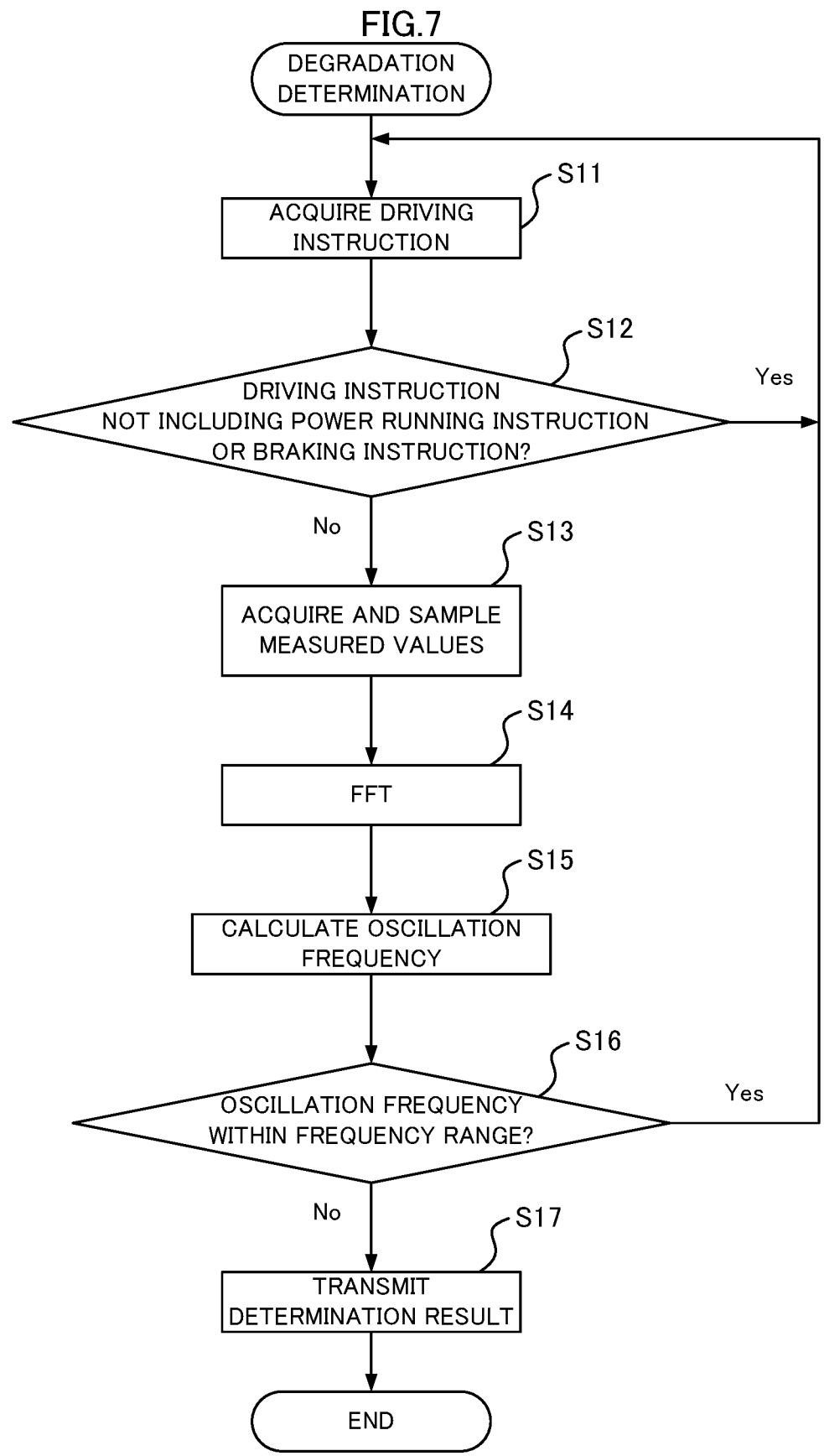
FIG. 7 is a flowchart illustrating exemplary steps of a degradation determining process executed by the degradation determiner according to Embodiment 1.

After the closing and fastening of the cover 11 and the start of running of the vehicle, the degradation determiner 31 initiates the degradation determining process illustrated in FIG. 7. For example, an interlock mechanism is preferably provided to allow a contactor to be closed and electrically connect the electronic equipment 71 accommodated in the housing 10 to a power source only when the cover 11 is closed and fastened. In this case, in response to the closing and fastening of the cover 11 and the closing of the contactor, the electronic equipment 71 is connected to the power source and feeds electric power to the degradation determiner 31. In other words, the degradation determiner 31 is preferably allowed to execute the degradation determining process when the cover 11 is closed and fastened. Examples of the method for fastening the closed cover 11 include fixation by means of a latching mechanism, and engagement of the cover 11 with the housing 10.

The vibration of the cover 11 becomes big during acceleration or deceleration of the vehicle in comparison to that during coasting of the vehicle. In order to avoid erroneous determination of occurrence of degradation in the sealing member 14 on the basis of the mechanical vibration of the cover 11 during acceleration or deceleration of the vehicle, the degradation determiner 31 preferably determines whether any degradation occurs in the sealing member 14 on the basis of the mechanical vibration measured by the first vibration sensor 13 during coasting of the vehicle. The degradation determiner 31 in Embodiment 1 thus acquires a driving instruction for designating an acceleration of the vehicle from the train information management system 91 and then determines whether the vehicle is coasting on the basis of the driving instruction. When determining that the vehicle is coasting, the degradation determiner 31 determines whether any degradation occurs in the sealing member 14.

The driving instruction is input to the train information management system 91 in response to a manipulation on a master controller installed in the cab. Specifically, the driving instruction may include a power running instruction for instructing the vehicle to increase the speed or a braking instruction for instructing the vehicle to decrease the speed, or may include neither of the power running instruction and the braking instruction. The power running instruction designates a positive acceleration, and the braking instruction designates a negative acceleration. When the driving instruction does not include the power running instruction or the braking instruction, the vehicle can be deemed to be coasting.

The degradation determining process executed by the degradation determiner 31 is described in detail below with reference to FIG. 7.

At the initiation of the degradation determining process, the communication circuit 44 acquires a driving instruction from the train information management system 91 (Step S11). When the driving instruction includes a power running instruction or a braking instruction (Step S12; Yes), the communication circuit 44 repeats Step S11. In contrast, when the driving instruction does not include the power running instruction or the braking instruction (Step S12; No), the sampling circuit 41 acquires measured values from the first vibration sensor 13, and samples a value measured by the first vibration sensor 13 every sampling period (Step S13).

The FFT circuit 42 executes FFT on the values measured by the first vibration sensor 13 and sampled in Step S13, and thereby generates a piece of frequency-domain data (Step S14). The determination circuit 43 calculates an oscillation frequency from the piece of frequency-domain data generated in Step S14 (Step S15).

The determination circuit 43 determines whether the oscillation frequency calculated in Step S15 falls within the predetermined frequency range. When the oscillation frequency calculated in Step S15 falls within the frequency range (Step S16; Yes), the individual components of the degradation determiner 31 repeat the above-described steps from Step S11.

In contrast, the oscillation frequency calculated in Step S15 does not fall within the predetermined range (Step S16; No), the communication circuit 44 transmits a determination result to the train information management system 91 (Step S17). In detail, the communication circuit 44 transmits a determination result indicating that any degradation occurs in the sealing member 14 to the train information management system 91. After completion of Step S17, the degradation determiner 31 terminates the degradation determining process.

As described above, the degradation determiner 31 included in the in-vehicle device 1 according to Embodiment 1 determines whether any degradation occurs in the sealing member 14 on the basis of the mechanical vibration measured by the first vibration sensor 13 while the cover 11 is closed. The degradation determiner 31 then transmits a determination result to the train information management system 91. This configuration can maintain the waterproofness and dust resistance of the in-vehicle device 1. In detail, the in-vehicle device 1 determines whether any degradation occurs in the sealing member 14, and suggests maintenance involving replacement of the sealing member 14 when any degradation occurs in the sealing member 14. This configuration can inhibit contaminants, such as dust and water drops, from entering the in-vehicle device 1 due to degradation of the sealing member 14.

The frequency range applied to determination of occurrence of degradation in the sealing member 14 may be defined depending on the oscillation frequency of the mechanical vibration of the cover 11 in the state where the air tightness necessary for the housing 10 of the in-vehicle device 1 is achieved despite of occurrence of degradation in the sealing member 14. This configuration can determine whether any degradation occurs in the sealing member 14 at the stage before losing the air tightness necessary for the housing 10. The configuration can suggest maintenance involving replacement of the sealing member 14 before losing the air tightness necessary for the housing 10.

Embodiment 2

The first vibration sensor 13 is not necessarily disposed at the position in the example illustrated in Embodiment 1 and may also be disposed at any position provided that the first vibration sensor 13 can measure mechanical vibration of any cover included in the in-vehicle device. The description of Embodiment 2 is directed to an in-vehicle device 2 further including a first vibration sensor 18 disposed at a position different from that in Embodiment 1.

Figure 8:
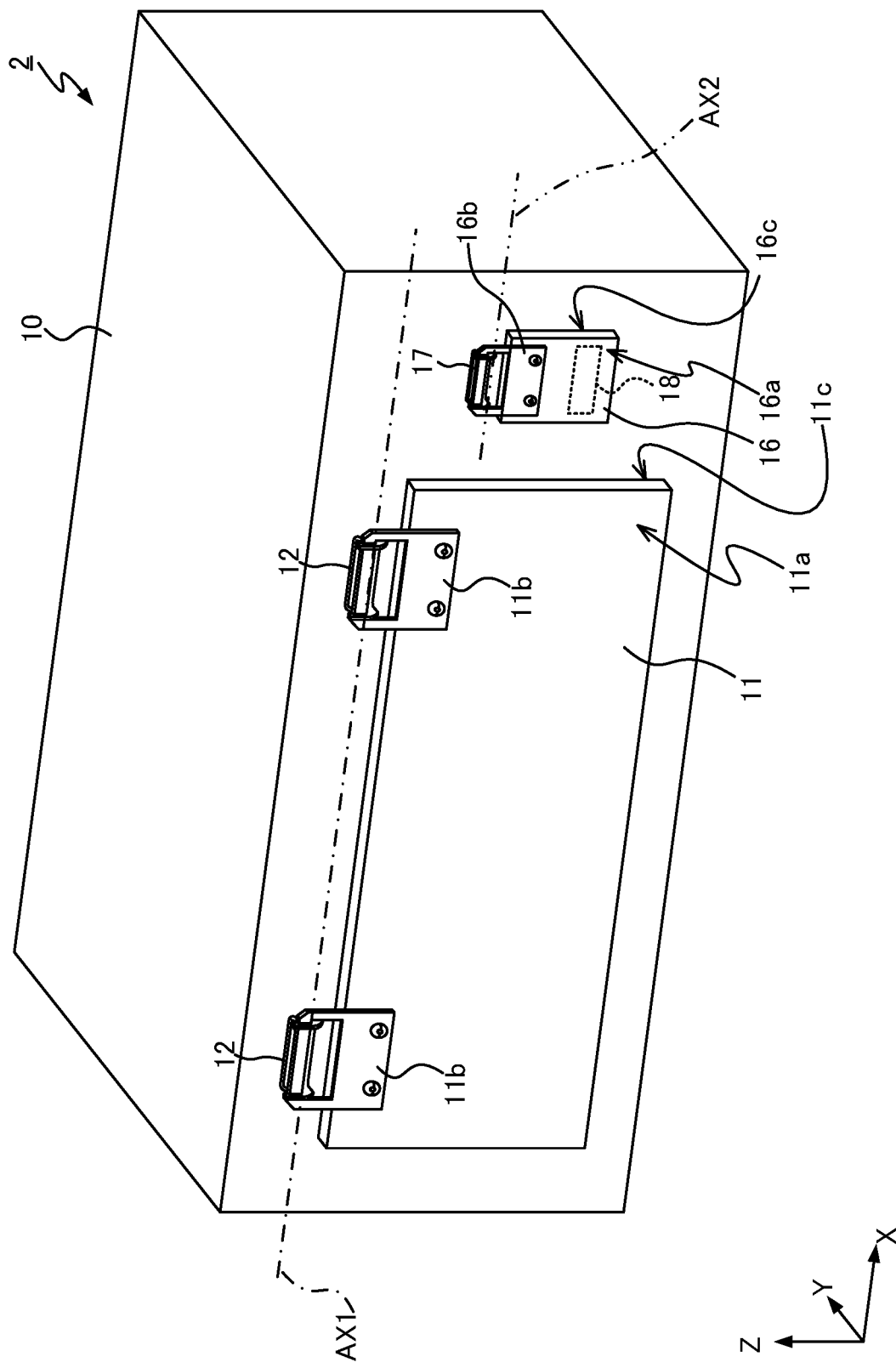
FIG. 8 is a perspective view of an in-vehicle device according to Embodiment 2.
Figure 9:
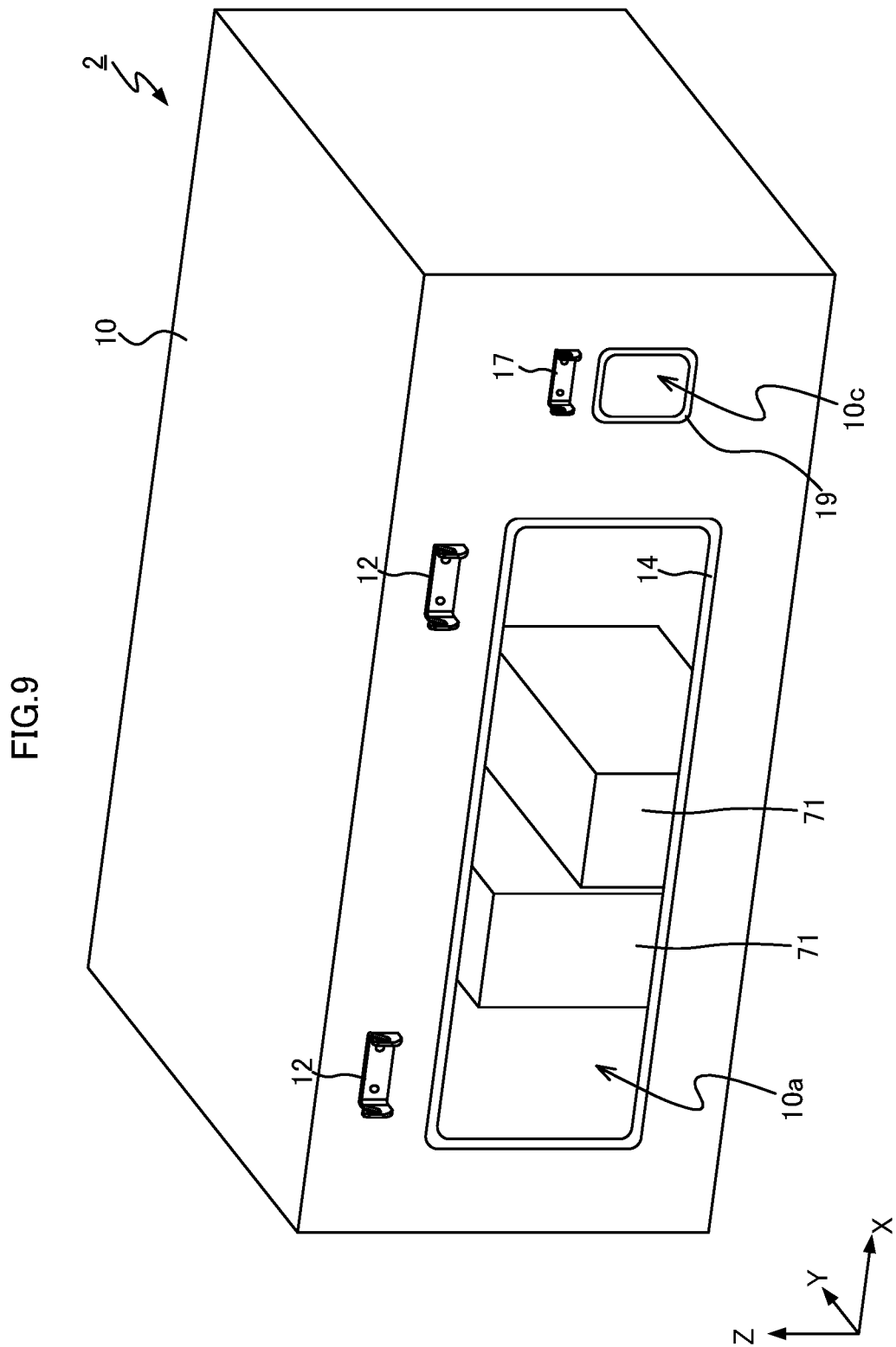
FIG. 9 is another perspective view of the in-vehicle device according to Embodiment 2.

As illustrated in FIG. 8, the in-vehicle device 2 includes the housing 10, the cover 11, and the two support members 12, as in Embodiment 1. As illustrated in FIG. 9, which is a perspective view of the in-vehicle device 2 after removal of the cover 11, the in-vehicle device 2 includes the sealing member 14, as in Embodiment 1. The in-vehicle device 2 further includes an openable and closable cover 16 disposed over an opening 10c provided to the housing 10 and the circumference of the opening 10c, a support member 17 having the same shape as the support members 12 to support the cover 16, a first vibration sensor 18 to measure vibration of the cover 16, and a sealing member 19 disposed around the opening 10c such that the sealing member 19 is held between the housing 10 and the cover 16 when the cover 16 is closed.

The sealing members 14 and 19 are made of the same material. The sealing member 19 has a groove to engage with the edge of the opening 10c, like the sealing member 14. The sealing members 14 and 19 are thus expected to degrade at the same rate.

In the case where no degradation with age occurs in the sealing member 19, the sealing member 19 held and pressed between the housing 10 and the cover 16 while the cover 16 is closed has a sufficiently high resilience. This configuration can prevent a gap from being formed between the cover 16 and the housing 10. This structure with no gap can inhibit contaminants, such as dust and water drops, from entering the housing 10 through the opening 10c.

Unfortunately, when the resilience of the sealing member 19 decreases due to degradation with age, for example, a gap is formed between the sealing member 19 and the cover 16 or the housing 10 while the cover 16 is closed. This gap may allow contaminants, such as dust and water drops, to enter the housing 10 through the opening 10c.

When a gap is formed between the sealing member 19 and the cover 16 or the housing 10, the mechanical vibration of the cover 16 during running of the vehicle becomes bigger than that in the case of no gap between the sealing member 19 and the cover 16 or the housing 10. In view of these facts, the in-vehicle device 2 further includes a degradation determiner 32, which is described below, to determine whether any degradation occurs in the sealing member 19 on the basis of the mechanical vibration measured by the first vibration sensor 18 while the cover 16 is closed. Since the sealing members 14 and 19 are expected to degrade at the same rate, the determination of occurrence of degradation in the sealing member 19 can also achieve determination of occurrence of degradation in the sealing member 14. The in-vehicle device 2 can therefore determine whether any degradation occurs in the sealing members 14 and 19.

The individual components of the in-vehicle device 2 are described in detail below.

As illustrated in FIG. 9, the side surface of the housing 10 included in the in-vehicle device 2 has the opening 10c, separate from the opening 10a that allows for maintenance of the electronic equipment 71 accommodated in the housing 10. The opening 10c does not need to have the identical shape as the opening 10a. In the example illustrated in FIG. 9, the opening 10c has a smaller area than the opening 10a.

As illustrated in FIGS. 8 and 9, the cover 16 is disposed over the opening 10c and the circumference of the opening 10c. The cover 16 has an outer surface 16a that faces the outside of the housing 10, and the outer surface 16a is provided with an engaging member 16b fixed with fastening members. The engaging member 16b has a through hole, like the engaging member 11b. The engaging member 16b engages with the support member 17 while the support member 17 is inserted in the through hole of the engaging member 16b. The engaging member 16b is rotatable about a rotational axis AX2 while the support member 17 is inserted in the through hole. The cover 16 is thus supported by the support member 17 so as to be rotatable about the rotational axis AX2, and openable and closable by rotating about the rotational axis AX2. In FIG. 8, the rotational axis AX2 is represented by the dashed and double-dotted line. The rotational axis AX2 extends in the X-axis direction, that is, the horizontal direction.

Figure 10:
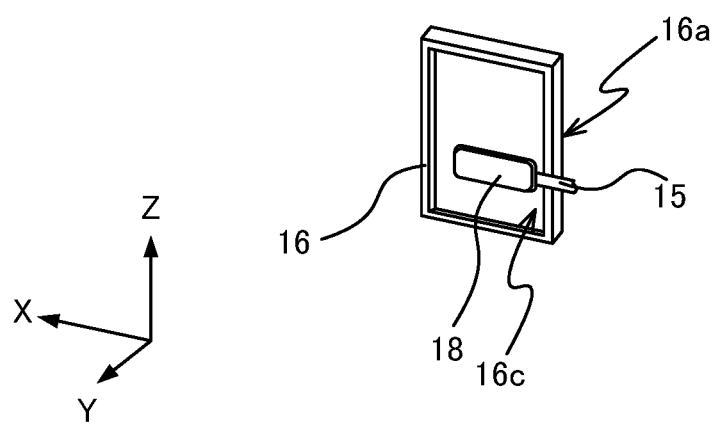
FIG. 10 is a perspective view of a cover according to Embodiment 2.

The cover 16 has an inner surface 16c that faces the inside of the housing 10, and the inner surface 16c is provided with the first vibration sensor 18, as illustrated in FIG. 10. FIG. 10 illustrates the cover 16 as viewed from the inside of the housing 10 while the cover 16 is closed. The cover 16 is preferably made of the same material as the cover 11.

The support member 17 is fixed with fastening members on the surface of the housing 10 provided with the opening 10a, like the support member 12. Specifically, the support member 17 is disposed at a position above the opening 10c in the vertical direction. The support member 17 has protrusions extending in a direction away from the housing 10, and each of the protrusions has a notch. The protrusions of the support member 17 are inserted in the through hole of the engaging member 16b and the engaging member 16b engages with the notches of the support member 17, so that the support member 17 supports the cover 16 such that the cover 16 is rotatable about the rotational axis AX2.

The first vibration sensor 18 has the configuration identical to that of the first vibration sensor 13. The first vibration sensor 18 is mounted on the cover 16 and measures mechanical vibration of the cover 16. In detail, the first vibration sensor 18 is mounted on the inner surface 16c of the cover 16 in a vertically bottom portion.

The first vibration sensor 18 is connected to the cable 15. The first vibration sensor 18 is fed with electric power and transmits measured values to the degradation determiner 32 via the cable 15. The first vibration sensor 18 is preferably fed with electric power from the electronic equipment 71.

Figure 11:
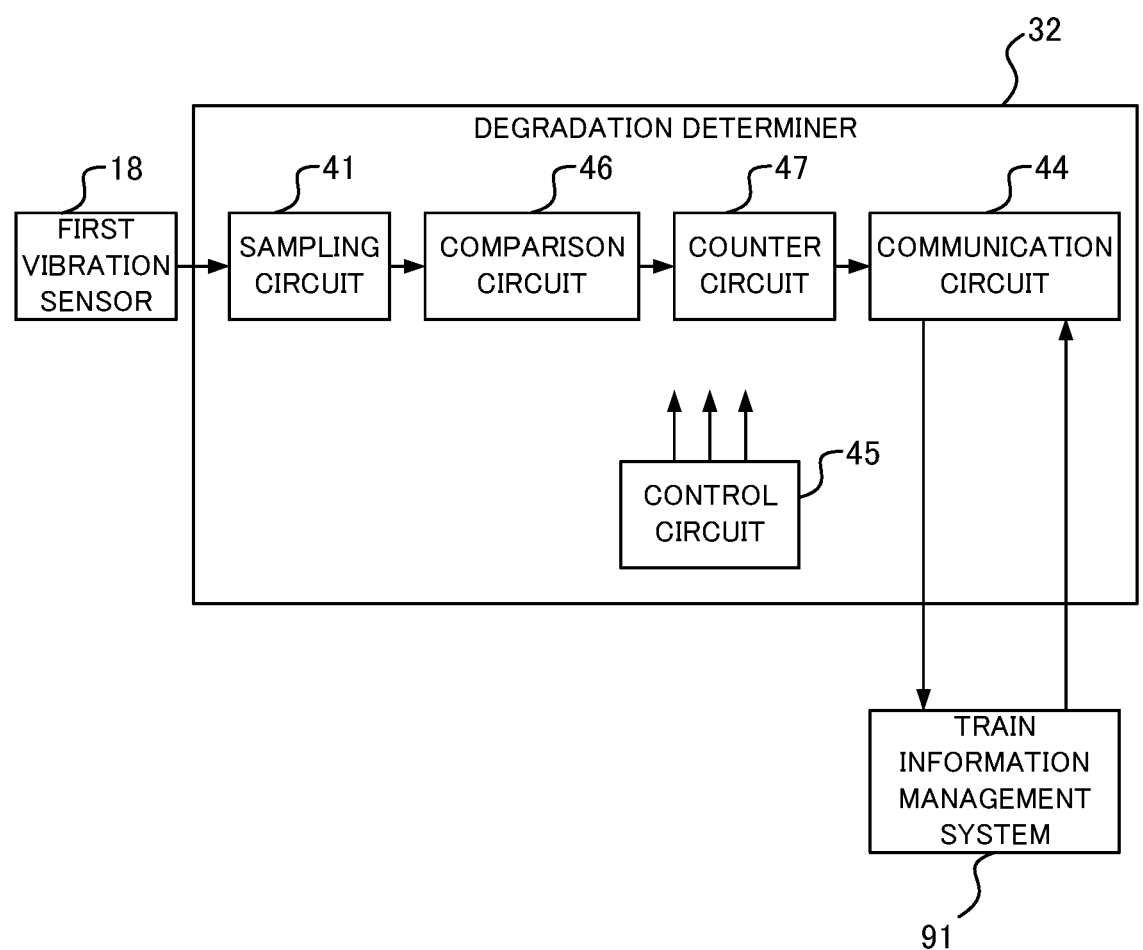
FIG. 11 is a block diagram illustrating a degradation determiner according to Embodiment 2.

The degradation determiner 32 is accommodated in the housing 10, and determines whether any degradation occurs in the sealing member 19 on the basis of the measured values of the mechanical vibration of the cover 16. In detail, as illustrated in FIG. 11, the degradation determiner 32 includes a sampling circuit 41 to sample values measured by the first vibration sensor 18, a comparison circuit 46 to determine whether the sampled values measured by the first vibration sensor 18 exceed an amplitude threshold, a counter circuit 47 to determine whether the number of times that the comparison circuit 46 determines the sampled values to exceed the amplitude threshold is larger than a predetermined number of times, a communication circuit 44 to transmit a determination result to the train information management system 91, and a control circuit 45 to control the individual components of the degradation determiner 32.

The individual components of the degradation determiner 32 are described in detail below.

The sampling circuit 41 samples a value measured by the first vibration sensor 18 every predetermined sampling period, as in Embodiment 1, and outputs the sampled values measured by the first vibration sensor 18 to the comparison circuit 46.

The comparison circuit 46 determines whether the sampled values measured by the first vibration sensor 18 exceed the amplitude threshold, and outputs a determination result to the counter circuit 47. For example, the comparison circuit 46 provides the counter circuit 47 with a determination result signal, which indicates 1 when a sampled value measured by the first vibration sensor 18 exceeds the amplitude threshold and indicates 0 when a sampled value measured by the first vibration sensor 18 is equal to or lower than the amplitude threshold.

The amplitude threshold is defined on the basis of possible values measured by the first vibration sensor 18 in the case where the cover 16 is considered to be certainly closed in view of the parameters, such as the air tightness necessary for the in-vehicle device 2, the material of the sealing member 19, and the materials of the housing 10 and the cover 16. In detail, possible values measured by the first vibration sensor 18 in the case where the cover 16 is considered to be certainly closed are calculated on the basis of simulations or test runs, and a value higher than the calculated possible values measured by the first vibration sensor 18 is applied as the amplitude threshold.

The counter circuit 47 counts the number of times that the sampled values measured by the first vibration sensor 18 exceed the amplitude threshold within a unit time, and determines whether the counted number is larger than the predetermined number of times. In detail, the counter circuit 47 accumulates the number of times that the comparison circuit 46 determines the sampled values to exceed the amplitude threshold within a unit time, and determines whether the accumulated number is larger than the predetermined number of times. For example, the counter circuit 47 includes an accumulator to accumulate values indicated by determination result signals received from the comparison circuit 46 within a unit time, and a comparator to compare a result of accumulation performed by the accumulator with the predetermined number of times.

When the number of times that the sampled values measured by the first vibration sensor 18 exceed the amplitude threshold within a unit time is equal to or smaller than the predetermined number of times, this situation can be deemed that no degradation occurs in the sealing member 19. The situation can also be deemed that no degradation occurs in the sealing member 14, which is expected to degrade at the same rate as the sealing member 19. In contrast, when the number of times that the sampled values measured by the first vibration sensor 18 exceed the amplitude threshold is larger than the predetermined number of times, this situation implies big vibration of the cover 16 and can be deemed that any degradation occurs in the sealing member 19. The situation can also be deemed that any degradation occurs in the sealing member 14, which is expected to degrade at the same rate as the sealing member 19.

The unit time can be any time that is at least the time necessary for acquiring an amount of sampled values measured by the first vibration sensor 18 sufficient for determination of occurrence of degradation in the sealing member 19 on the basis of the values measured by the first vibration sensor 18. The predetermined number of times may be any value equal to or higher than two so as not to mistake a sudden variation in the values measured by the first vibration sensor 18 as occurrence of degradation in the sealing member 19.

When the counter circuit 47 determines that the number of times that the values exceed the amplitude threshold within a unit time is larger than the predetermined number of times, the communication circuit 44 transmits a determination result indicating that any degradation occurs in the sealing members 14 and 19 to the train information management system 91.

The control circuit 45 controls the initiation, termination, and synchronization of processes of the individual components of the degradation determiner 32, that is, the sampling circuit 41, the comparison circuit 46, the counter circuit 47, and the communication circuit 44.

The degradation determiner 32 has the hardware configuration identical to that of the degradation determiner 31. The degradation determiner 32 is connected to the first vibration sensor 18 and the train information management system 91 via the interface 63.

The following description is directed to a degradation determining process executed by the degradation determiner 32 of the in-vehicle device 2 having the above-described configuration.

Figure 12:
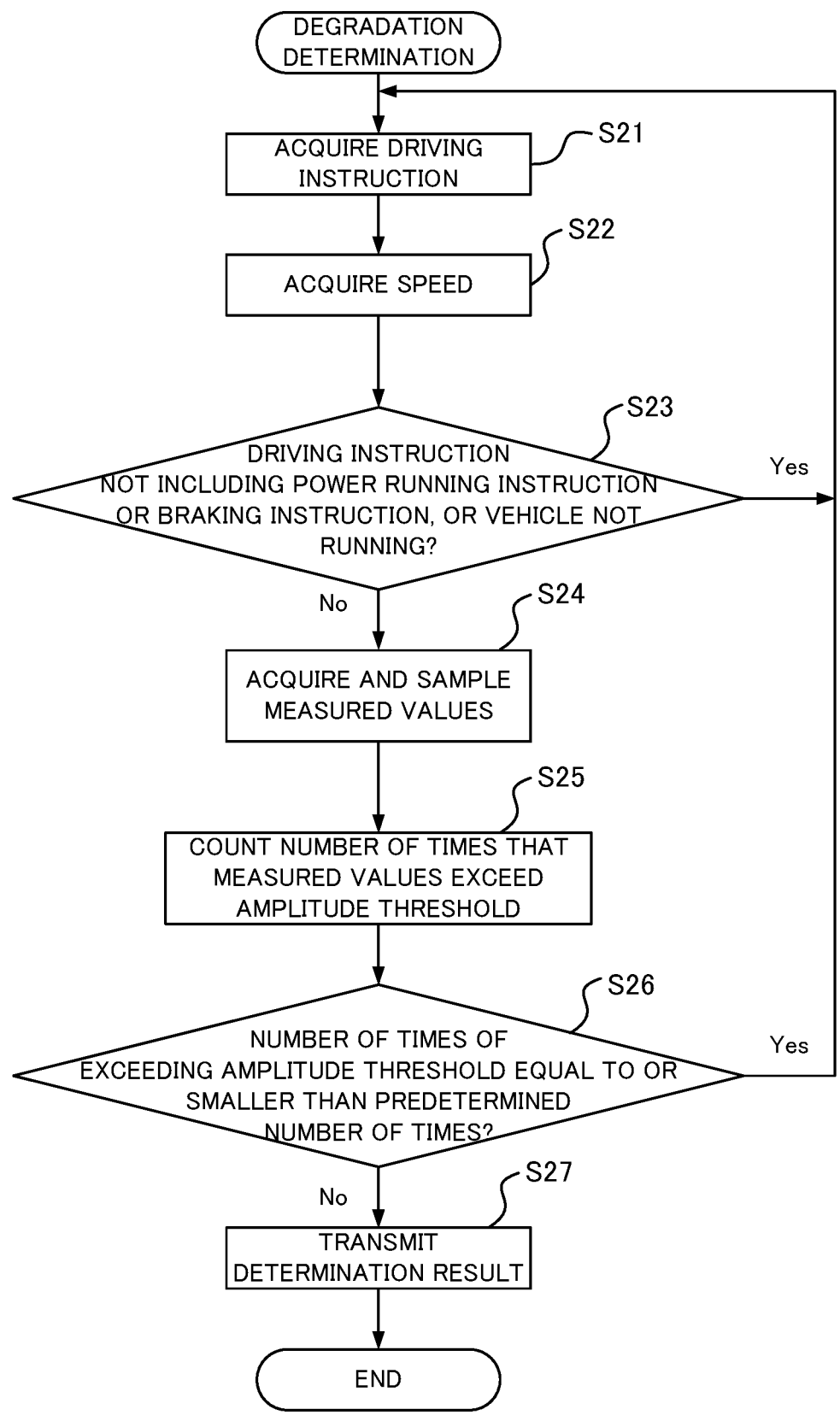
FIG. 12 is a flowchart illustrating exemplary steps of a degradation determining process executed by the degradation determiner according to Embodiment 2.

After the start of running of the vehicle, the degradation determiner 32 initiates the degradation determining process illustrated in FIG. 12. For example, an interlock mechanism is preferably provided to allow a contactor to be closed and electrically connect the electronic equipment 71 accommodated in the housing 10 to the power source only when the covers 11 and 16 are closed and fastened. In this case, in response to the closing and fastening of the covers 11 and 16 and the closing of the contactor, the electronic equipment 71 is connected to the power source and feeds electric power to the degradation determiner 32. In other words, the degradation determiner 32 is preferably allowed to execute the degradation determining process when the covers 11 and 16 are closed and fastened.

When the in-vehicle device 2 accommodates a device, such as fan, which generates vibration while the vehicle is standing still, the degradation determiner 32 can determine whether any degradation occurs in the sealing member 19 on the basis of the mechanical vibration measured by the first vibration sensor 18 while the vehicle is standing still. The degradation determiner 32 in Embodiment 2 thus determines whether any degradation occurs in the sealing member 19 on the basis of the mechanical vibration measured by the first vibration sensor 18 while the vehicle is coasting or standing still. In detail, the degradation determiner 32 acquires a driving instruction and the speed of the vehicle from the train information management system 91, and determines whether the vehicle is coasting and whether the vehicle is standing still. When the vehicle is coasting or standing still, the degradation determiner 32 determines whether any degradation occurs in the sealing member 19.

The degradation determining process executed by the degradation determiner 32 is described in detail below with reference to FIG. 12.

At the initiation of the degradation determining process, the communication circuit 44 acquires a driving instruction from the train information management system 91 (Step S21). The communication circuit 44 also acquires the speed of the vehicle from the train information management system 91 (Step S22). When the driving instruction includes a power running instruction or a braking instruction and when the vehicle is running (Step S23; Yes), the communication circuit 44 repeats Steps S21 and S22. In contrast, when the driving instruction does not include the power running instruction or the braking instruction or when the vehicle is not running (Step S23; No), the sampling circuit 41 acquires measured values from the first vibration sensor 18 and samples a value measured by the first vibration sensor 18 every sampling period (Step S24).

The comparison circuit 46 determines whether the values measured by the first vibration sensor 18 and sampled in Step S24 exceed the amplitude threshold. The counter circuit 47 then counts the number of times that the comparison circuit 46 determines the sampled values to exceed the amplitude threshold within a unit time (Step S25). When the counted result in Step S25 is equal to or smaller than the predetermined number of times (Step S26; Yes), the individual components of the degradation determiner 32 repeat the above-described steps from Step S21.

In contrast, when the counted result in Step S25 exceeds the predetermined number of times (Step S26; No), the communication circuit 44 transmits a determination result to the train information management system 91 (Step S27). In detail, the communication circuit 44 transmits a determination result indicating that any degradation occurs in the sealing members 14 and 19 to the train information management system 91. After completion of Step S27, the degradation determiner 32 terminates the degradation determining process.

As described above, the degradation determiner 32 included in the in-vehicle device 2 according to Embodiment 2 determines whether any degradation occurs in the sealing member 19 on the basis of the mechanical vibration measured by the first vibration sensor 18 while the cover 16 is closed. Since the sealing member 14 is expected to degrade at the same rate as the sealing member 19, the determination of occurrence of degradation in the sealing member 19 can also achieve determination of occurrence of degradation in the sealing member 14. The degradation determiner 32 then transmits a determination result to the train information management system 91. This configuration can maintain the waterproofness and dust resistance of the in-vehicle device 2. In detail, the in-vehicle device 2 determines whether any degradation occurs in the sealing member 19, and suggests maintenance involving replacement of the sealing members 14 and 19 when any degradation occurs in the sealing member 19. This configuration can inhibit contaminants, such as dust and water drops, from entering the in-vehicle device 2 due to degradation in the sealing members 14 and 19.

The opening 10c is designed to have a size smaller than the opening 10a, thereby reducing the size of the cover 16 in comparison to the cover 11. Accordingly, the ratio of the area of the cover 16 in contact with the sealing member 19 to the entire area of the cover 16 is higher than that of the cover 11. The degradation of the sealing member 19 thus more significantly affects the vibration of the cover 16 than that of the cover 11. The degradation determiner 32 can therefore more accurately determine whether any degradation occurs in the sealing member 19 in comparison to the degradation determiner 31.

Embodiment 3

The occurrence of degradation in the sealing member 14 may also be determined on the basis of the values measured by multiple vibration sensors. The following description of Embodiment 3 is directed to an in-vehicle device 3 to determine whether any degradation occurs in the sealing member 14 on the basis of the respective values measured by the first vibration sensor 13 and a second vibration sensor 20.

Figure 13:
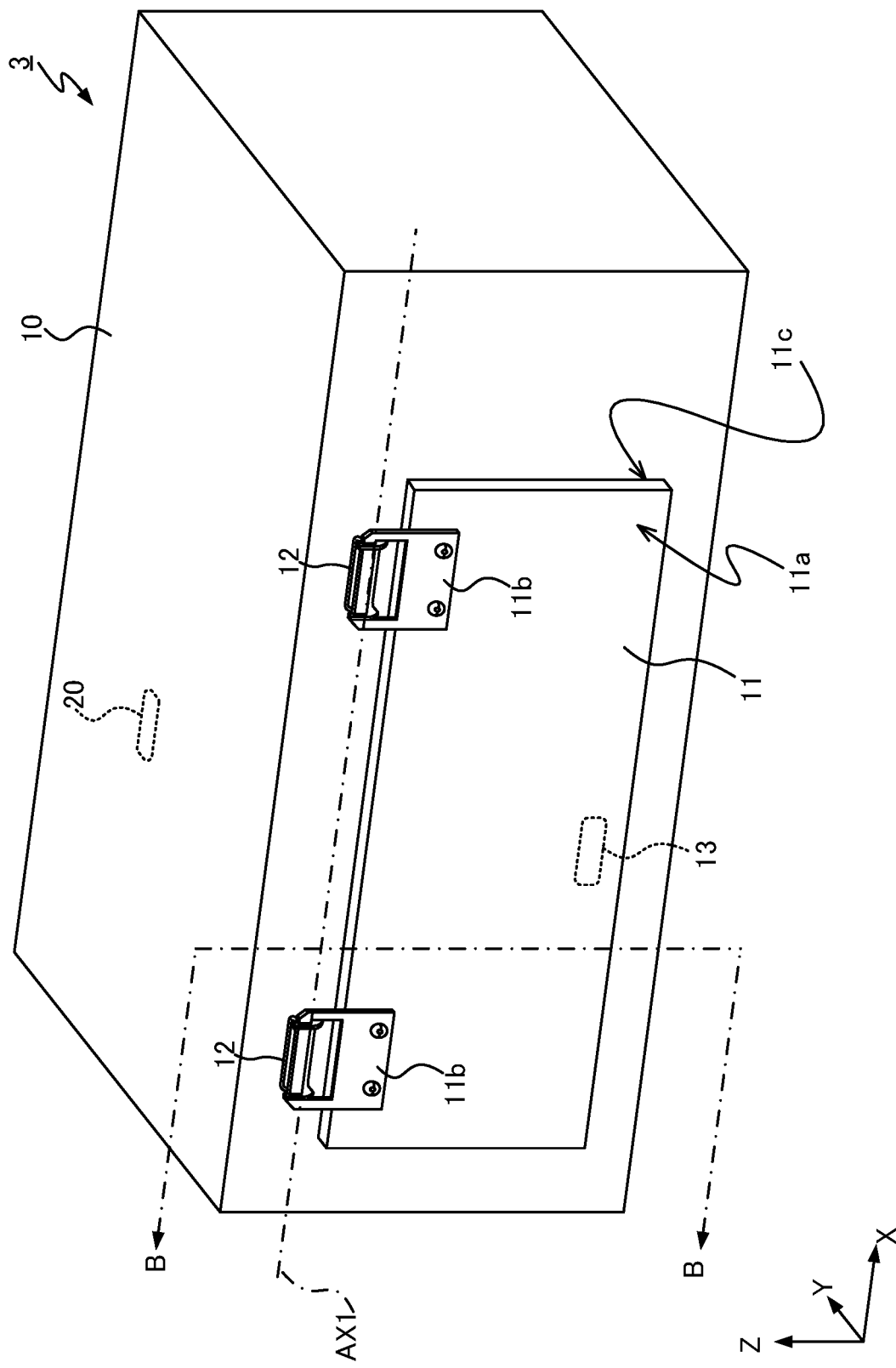
FIG. 13 is a perspective view of an in-vehicle device according to Embodiment 3.
Figure 14:
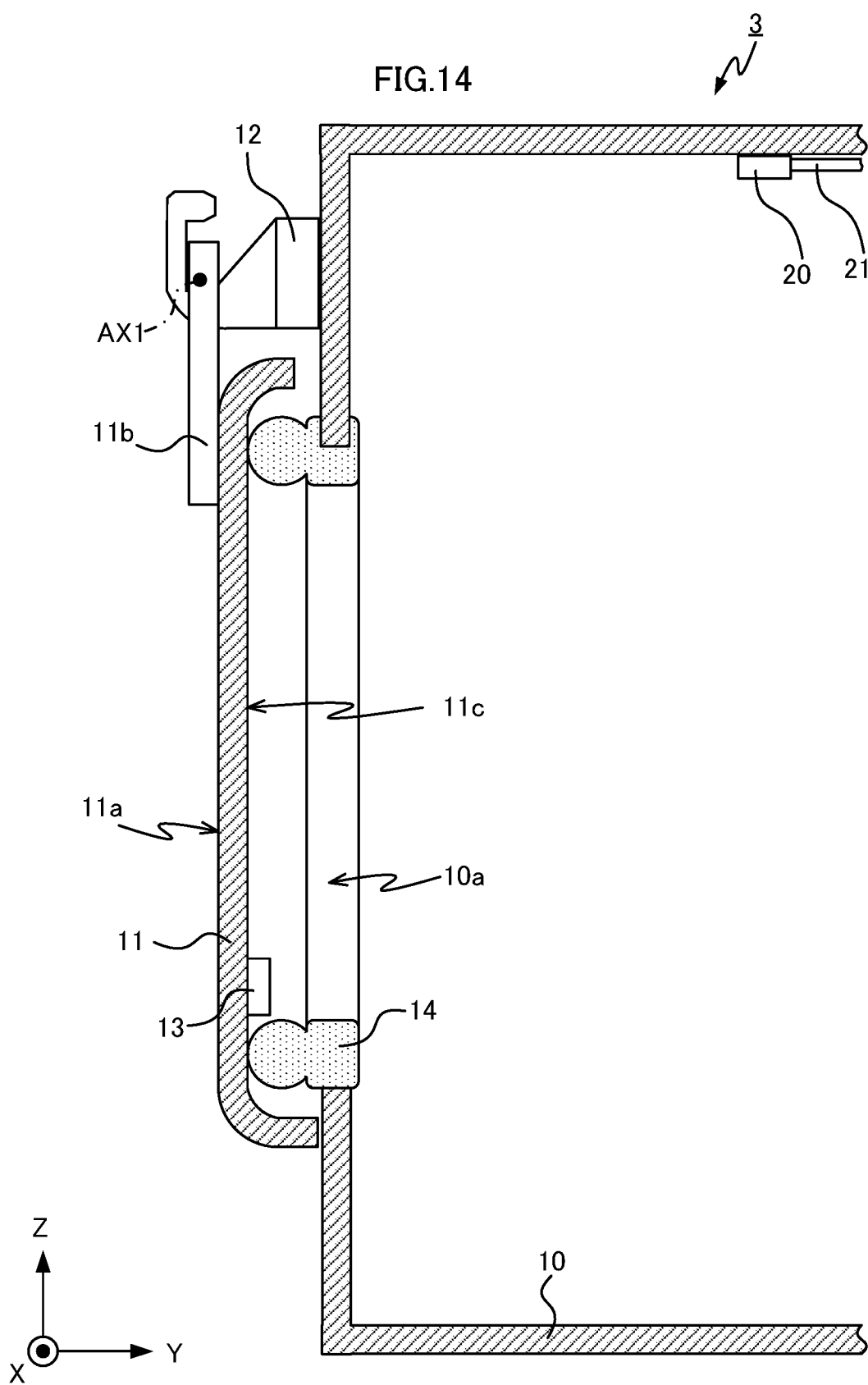
FIG. 14 is a partial sectional view of the in-vehicle device according to Embodiment 3 taken along the line B-B of FIG. 13.

As illustrated in FIG. 13 and FIG. 14, which is a partial sectional view taken along the line B-B of FIG. 13, the in-vehicle device 3 includes the housing 10, the cover 11, the two support members 12, the first vibration sensor 13, and the sealing member 14, as in Embodiment 1. The in-vehicle device 3 further includes the second vibration sensor 20 to measure mechanical vibration of the housing 10.

In the case where no degradation with age occurs in the sealing member 14, the sealing member 14 held and pressed between the housing 10 and the cover 11 while the cover 11 is closed has a sufficiently high resilience. As illustrated in FIG. 14, this configuration can prevent a gap from being formed between the cover 11 and the housing 10. This structure with no gap can inhibit contaminants, such as dust and water drops, from entering the housing 10 through the opening 10a. FIG. 14 does not illustrate the electronic equipment 71.

Unfortunately, when the resilience of the sealing member 14 decreases due to degradation with age, for example, a gap is formed between the sealing member 14 and the cover 11 or the housing 10 while the cover 11 is closed. This gap may allow contaminants, such as dust and water drops, to enter the housing 10 through the opening 10a.

When a gap is formed between the sealing member 14 and the cover 11 or the housing 10, the mechanical vibration of the cover 11 during running of the vehicle becomes bigger than the mechanical vibration of the housing 10. In view of these facts, the in-vehicle device 3 further includes a degradation determiner 33, which is described below, to determine whether any degradation occurs in the sealing member 14 on the basis of the mechanical vibration measured by the first vibration sensor 13 and the second vibration sensor 20 while the cover 11 is closed. The in-vehicle device 3 can therefore determine whether any degradation occurs in the sealing member 14.

The individual components of the in-vehicle device 3 are described in detail below.

The second vibration sensor 20 is mounted on the housing 10 and measures mechanical vibration of the housing 10. A typical example of the second vibration sensor 20 is a contact-type acceleration sensor. In detail, the second vibration sensor 20 is mounted on the inner surface of the housing 10 in a vertically top portion.

The second vibration sensor 20 is connected to a cable 21. The second vibration sensor 20 is fed with electric power and transmits measured values to the degradation determiner 33 via the cable 21. The second vibration sensor 20 is preferably fed with electric power from the electronic equipment 71.

The degradation determiner 33 is accommodated in the housing 10 and determines whether any degradation occurs in the sealing member 14 on the basis of the mechanical vibration of the cover 11 and the mechanical vibration of the housing 10. For example, the degradation determiner 33 determines whether any degradation occurs in the sealing member 14 on the basis of the difference between the maximum amplitude of the mechanical vibration of the cover 11 and the maximum amplitude of the mechanical vibration of the housing 10.

Figure 15:
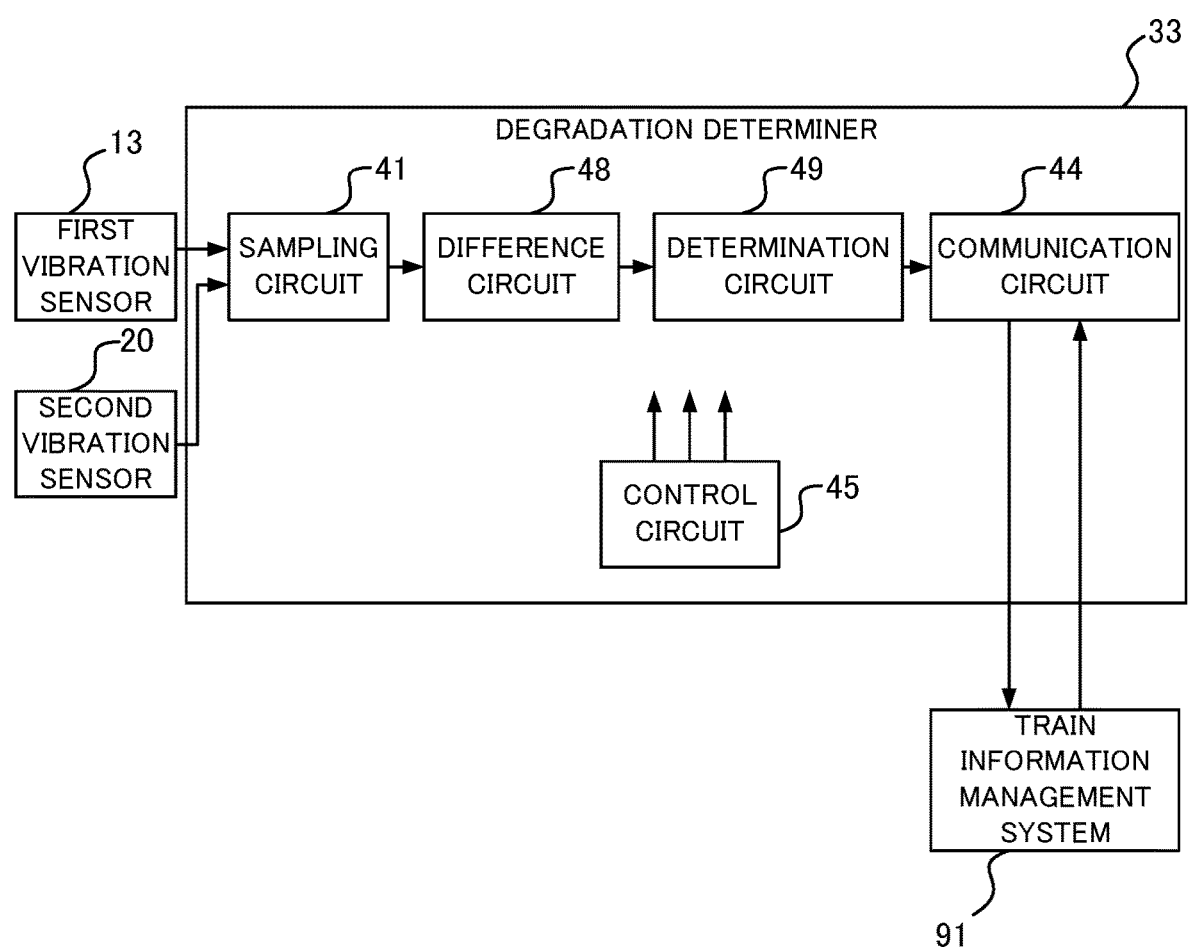
FIG. 15 is a block diagram illustrating a degradation determiner according to Embodiment 3.

In detail, as illustrated in FIG. 15, the degradation determiner 33 includes a sampling circuit 41 to sample the respective values measured by the first vibration sensor 13 and the second vibration sensor 20, a difference circuit 48 to calculate the difference between the maximum value of the sampled values measured by the first vibration sensor 13 and the maximum value of the sampled values measured by the second vibration sensor 20, a determination circuit 49 to determine whether the difference calculated by the difference circuit 48 falls within a predetermined difference range, a communication circuit 44 to transmit a result of determination performed by the determination circuit 49 to the train information management system 91, and a control circuit 45 to control the individual components of the degradation determiner 33. The degradation determiner 33 has the hardware configuration identical to that of the degradation determiner 31. The degradation determiner 33 is connected to the first vibration sensor 13, the second vibration sensor 20, and the train information management system 91 via the interface 63.

The individual components of the degradation determiner 33 are described in detail below.

The sampling circuit 41 samples a value measured by the first vibration sensor 13 every predetermined sampling period. The sampling circuit 41 also samples a value measured by the second vibration sensor 20 every predetermined sampling period. The sampling circuit 41 then outputs the sampled values measured by the first vibration sensor 13 and the sampled values measured by the second vibration sensor 20 to the difference circuit 48.

The difference circuit 48 calculates the maximum value of the sampled values measured by the first vibration sensor 13 and the maximum value of the sampled values measured by the second vibration sensor 20 within a unit time. The difference circuit 48 then calculates the difference between the maximum value of the sampled values measured by the first vibration sensor 13 and the maximum value of the sampled values measured by the second vibration sensor 20, and outputs the calculated difference to the determination circuit 49. The unit time may be any time that is at least the time necessary for acquiring amounts of sampled values measured by the first vibration sensor 13 and sampled values measured by the second vibration sensor 20 sufficient for determination of occurrence of degradation in the sealing member 14 on the basis of the respective values measured by the first vibration sensor 13 and the second vibration sensor 20.

The determination circuit 49 determines whether the difference calculated by the difference circuit 48 falls within the predetermined difference range. For example, the determination circuit 49 includes a comparator to compare the difference calculated by the difference circuit 48 with each of the upper limit and the lower limit of the difference range. When the difference calculated by the difference circuit 48 falls within the difference range, this situation implies that the vibration of the cover 11 is not bigger than the vibration of the housing 10 and can be deemed that no degradation occurs in the sealing member 14. In contrast, when the difference calculated by the difference circuit 48 does not fall within the difference range, this situation implies that the vibration of the cover 11 is bigger than the vibration of the housing 10 and can be deemed that any degradation occurs in the sealing member 14.

The difference range is defined on the basis of possible values of the difference between the maximum value of the values measured by the first vibration sensor 13 and the maximum value of the values measured by the second vibration sensor 20, in the case where the cover 11 is considered to be certainly closed in view of the parameters, such as the air tightness necessary for the in-vehicle device 3, the material of the sealing member 14, and the materials of the housing 10 and the cover 11. In detail, possible values of the difference between the value measured by the first vibration sensor 13 and the value measured by the second vibration sensor 20 in the case where the cover 11 is considered to be certainly closed are calculated on the basis of simulations or test runs, and a value range encompassing the possible values of the difference between the maximum value of the values measured by the first vibration sensor 13 and the maximum value of the values measured by the second vibration sensor 20 is applied as the difference range.

When the determination circuit 49 determines that the difference calculated by the difference circuit 48 does not fall within the difference range, the communication circuit 44 transmits a determination result indicating that any degradation occurs in the sealing member 14 to the train information management system 91.

The control circuit 45 controls the initiation, termination, and synchronization of processes of the individual components of the degradation determiner 33, that is, the sampling circuit 41, the difference circuit 48, the determination circuit 49, and the communication circuit 44.

The following description is directed to a degradation determining process executed by the degradation determiner 33 of the in-vehicle device 3 having the above-described configuration.

Figure 16:
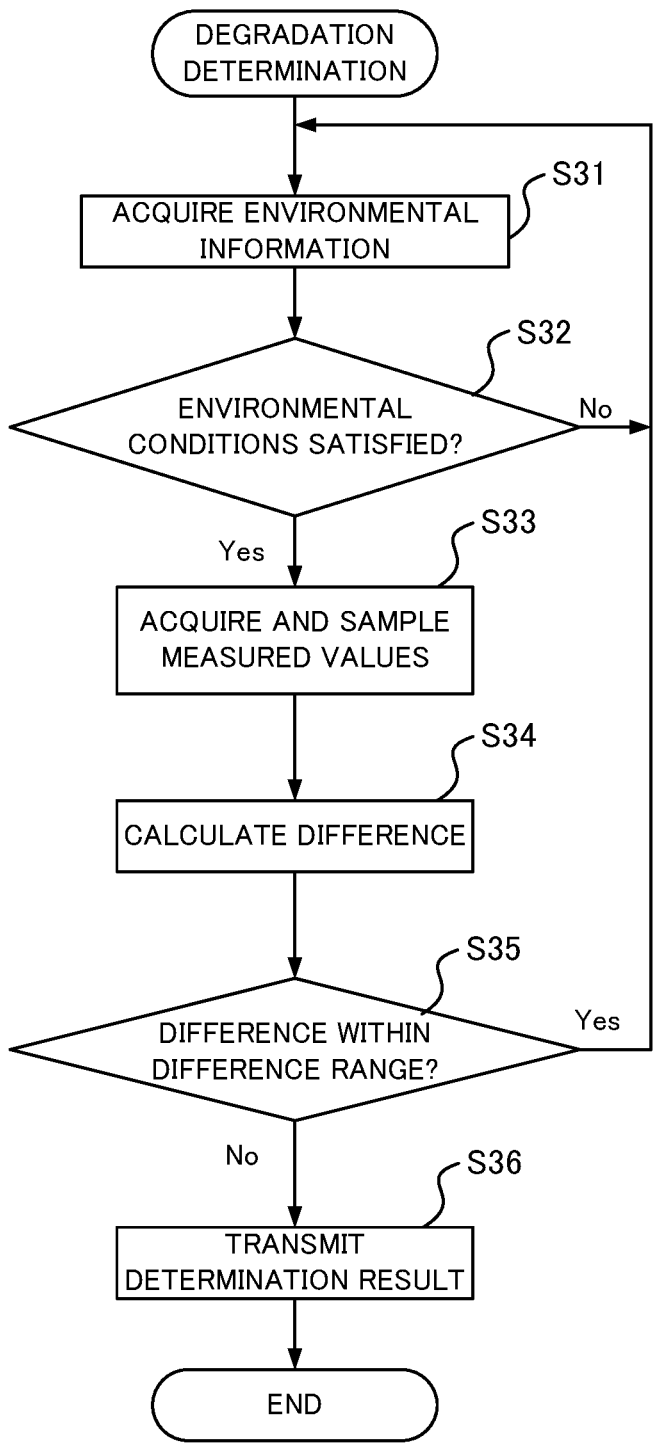
FIG. 16 is a flowchart illustrating exemplary steps of a degradation determining process executed by the degradation determiner according to Embodiment 3.

After the start of running of the vehicle, the degradation determiner 33 initiates the degradation determining process illustrated in FIG. 16. For example, an interlock mechanism is preferably provided to allow a contactor to be closed and electrically connect the electronic equipment 71 accommodated in the housing 10 to the power source only when the cover 11 is closed and fastened. In this case, in response to the closing and fastening of the cover 11 and the closing of the contactor, the electronic equipment 71 is connected to the power source and feeds electric power to the degradation determiner 33. In other words, the degradation determiner 33 is preferably allowed to execute the degradation determining process when the cover 11 is closed and fastened.

The mechanical vibration of the cover 11 caused by running of the vehicle significantly varies during sliding of the vehicle. The sliding of the vehicle occurs because of a decrease in friction coefficient of the contact surface between wheels and rails. Some of the causes of such a decrease in friction coefficient are environmental factors, such as a place where the vehicle is running, ambient temperature, and weather. In order to avoid erroneous determination of occurrence of degradation in the sealing member 14 on the basis of the mechanical vibration of the cover 11 during sliding of the vehicle, the degradation determiner 33 preferably determines whether any degradation occurs in the sealing member 14 when the vehicle is less likely to slide in view of the environmental factors. The degradation determiner 33 in Embodiment 3 thus acquires pieces of environmental information containing at least one of the place where the vehicle is running, the ambient temperature outside the housing 10, and the weather, and determines whether any degradation occurs in the sealing member 14 when the environmental conditions defined for the respective pieces of environmental information are satisfied.

For example, the degradation determiner 33 may preliminarily retain the condition that the vehicle is located in a straight course, as the environmental condition related to the place where the vehicle is running. The degradation determiner 33 may also preliminarily retain the condition of the ambient temperature of at least 20° C. and at most 25° C., as the environmental condition related to the ambient temperature. The degradation determiner 33 may also preliminarily retain the condition of the sunny weather, as the environmental condition related to the weather. In this case, when the vehicle is running in a straight course and when the ambient temperature is at least 20° C. and at most 25° C. and when the weather is sunny, the degradation determiner 33 may determine whether any degradation occurs in the sealing member 14.

The degradation determining process executed by the degradation determiner 33 is described in detail below with reference to FIG. 16.

At the initiation of the degradation determining process, the communication circuit 44 acquires pieces of environmental information from the train information management system 91 (Step S31). When the environmental conditions defined for the respective pieces of environmental information are not satisfied (Step S32; No), the communication circuit 44 repeats Step S31. In contrast, when the environmental conditions defined for the respective pieces of environmental information are satisfied (Step S32; Yes), the sampling circuit 41 acquires the respective values measured by the first vibration sensor 13 and the second vibration sensor 20, and samples a value measured by the first vibration sensor 13 and a value measured by the second vibration sensor 20 every sampling period (Step S33).

The difference circuit 48 calculates the maximum value of the sampled values measured by the first vibration sensor 13 and the maximum value of the sampled values measured by the second vibration sensor 20 within a unit time, and calculates the difference between the maximum value of the sampled values measured by the first vibration sensor 13 and the maximum value of the sampled values measured by the second vibration sensor 20 (Step S34).

The determination circuit 49 determines whether the difference calculated in Step S34 falls within the predetermined difference range. When the difference calculated in Step S34 falls within the difference range (Step S35; Yes), the individual components of the degradation determiner 33 repeat the above-described steps from Step S31.

In contrast, when the difference calculated in Step S34 does not fall within the difference range (Step S35; No), the communication circuit 44 transmits a determination result to the train information management system 91 (Step S36). In detail, the communication circuit 44 transmits a determination result indicating that any degradation occurs in the sealing member 14 to the train information management system 91. After completion of Step S36, the degradation determiner 33 terminates the degradation determining process.

As described above, the degradation determiner 33 included in the in-vehicle device 3 according to Embodiment 3 determines whether any degradation occurs in the sealing member 14 on the basis of the mechanical vibration measured by the first vibration sensor 13 and the second vibration sensor 20 while the cover 11 is closed. Since the determination of occurrence of degradation in the sealing member 19 is executed on the basis of the respective values measured by the first vibration sensor 13 and the second vibration sensor 20, occurrence of degradation in the sealing member 14 can be determined even during acceleration or deceleration of the vehicle.

The degradation determiner 33 determines whether any degradation occurs in the sealing member 14 when the vehicle is less likely to slide in view of the environmental information. This configuration can improve the accuracy of determination of occurrence of degradation in the sealing member 14.

Embodiment 4

The above-described degradation determining process is a mere example. The description of Embodiment 4 is directed to an in-vehicle device 4 to determine whether any degradation occurs in sealing members 25 on the basis of values measured by first vibration sensors 24 mounted on respective covers 22.

Figure 17:
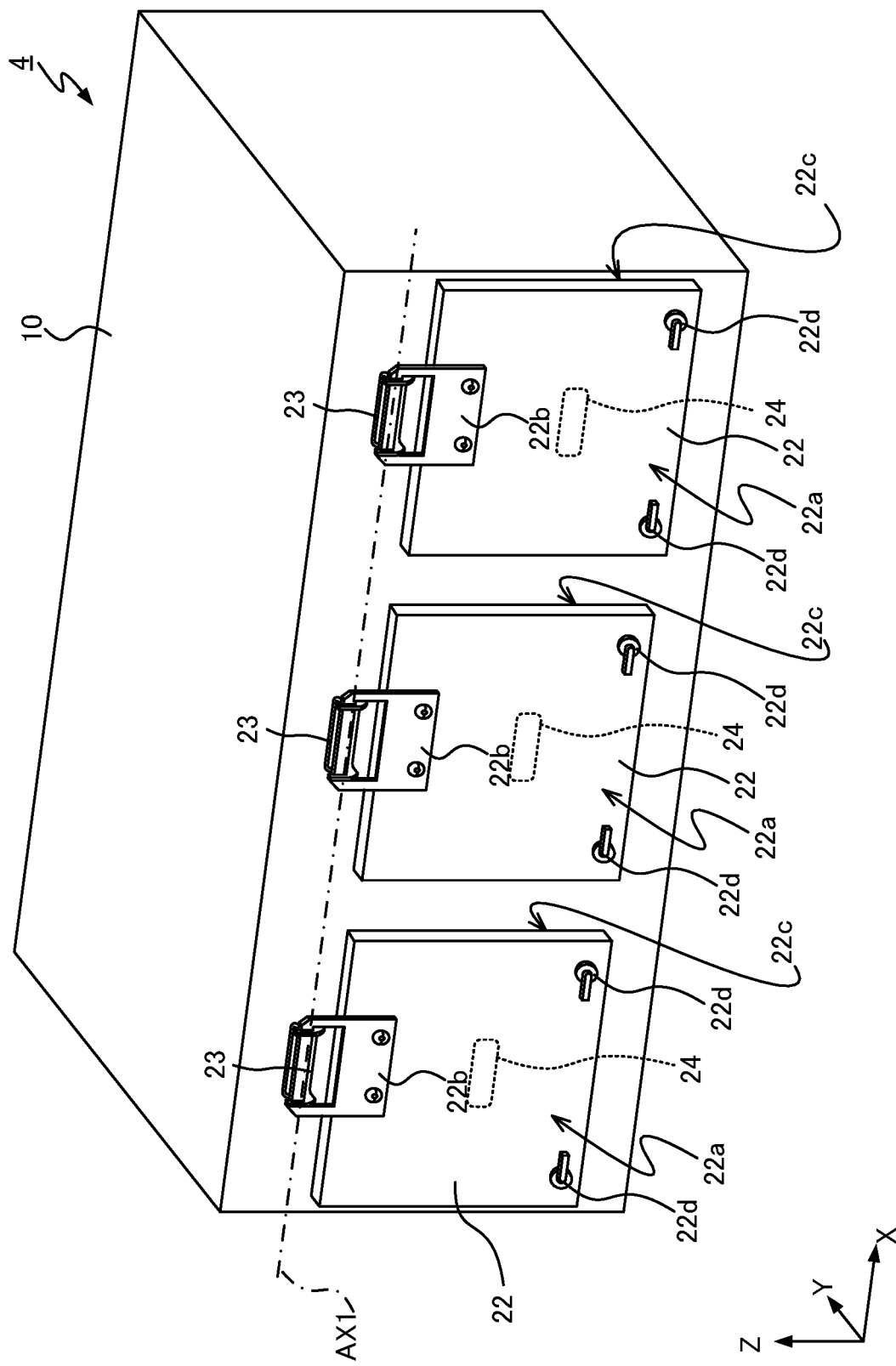
FIG. 17 is a perspective view of an in-vehicle device according to Embodiment 4.
Figure 18:
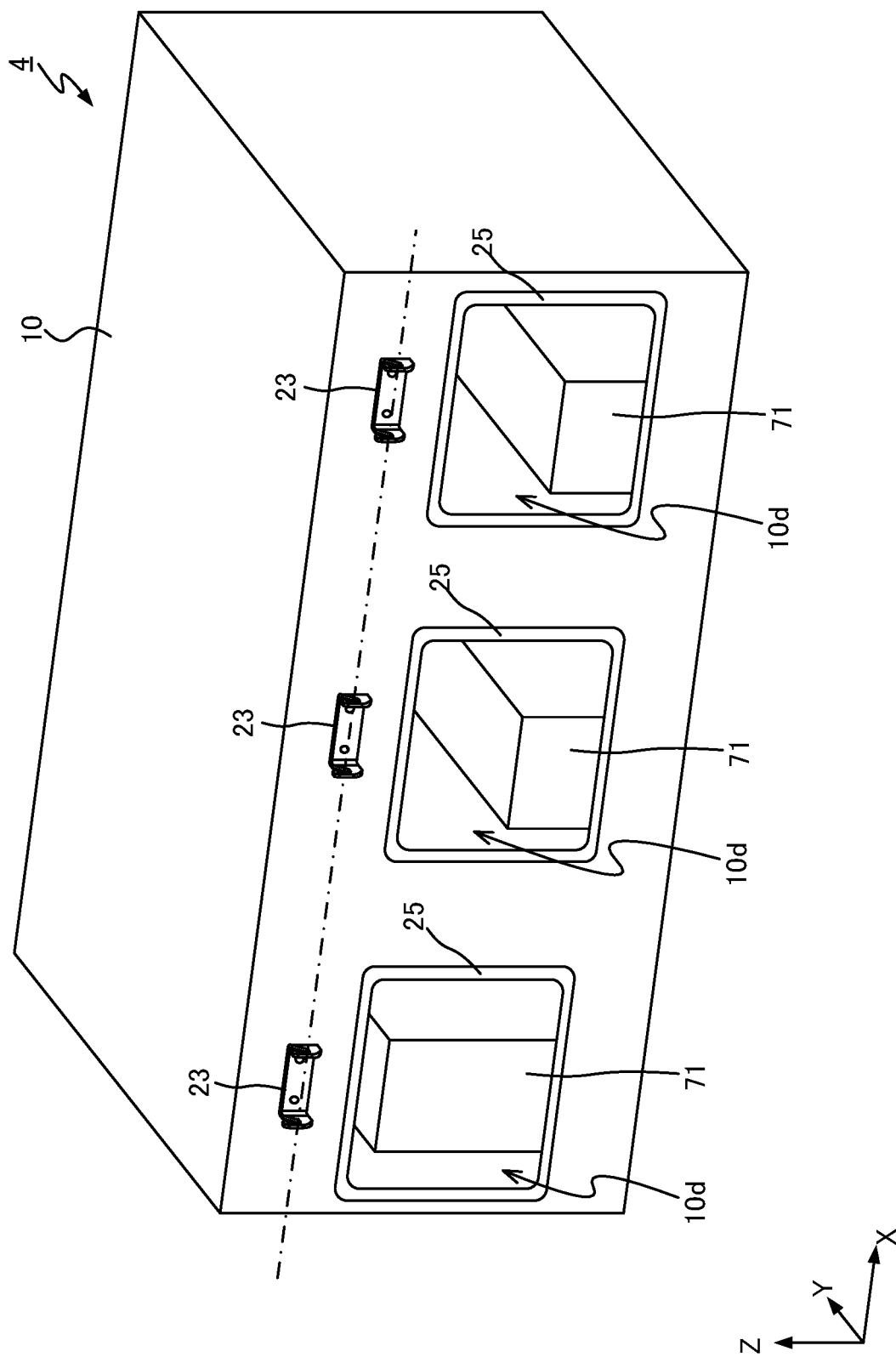
FIG. 18 is another perspective view of the in-vehicle device according to Embodiment 4.

As illustrated in FIG. 17, the in-vehicle device 4 includes the housing 10, the openable and closable covers 22, and support members 23 each having the same shape as the support member 12 to support each of the covers 22, and the first vibration sensors 24 to measure mechanical vibration of the respective covers 22. FIG. 17 can be understood like FIG. 1. As illustrated in FIG. 18, which is a perspective view of the in-vehicle device 4 after removal of the covers 22, the housing 10 has multiple openings 10d. FIG. 18 can be understood like FIG. 2. As illustrated in FIG. 18, the in-vehicle device 4 further includes the sealing members 25 each of which is disposed around each of the openings 10d such that the sealing member 25 is held between the housing 10 and each of the covers 22 when the cover 22 is closed, and restricting members 22d to restrict movement of the covers 22 while the covers 22 are closed.

In the case where no degradation with age occurs in the sealing members 25, each of the sealing members 25 held between the housing 10 and each of the covers 22 while the cover 22 is closed has a sufficiently high resilience. This configuration can prevent a gap from being formed between each of the covers 22 and the housing 10. This structure with no gap can inhibit contaminants, such as dust and water drops, from entering the housing 10 through each of the openings 10d.

Unfortunately, when the resilience of each of the sealing members 25 decreases due to degradation with age, for example, a gap is formed between each of the sealing members 25 and each of the covers 22 or the housing 10 while the cover 22 is closed. This gap may allow contaminants, such as dust and water drops, to enter the housing 10 through each of the openings 10d. The individual sealing members 25 have the identical shape and are made of the same material, and are therefore expected to degrade at the same rate.

When a gap is formed between each of the sealing members 25 and each of the covers 22 or the housing 10, the mechanical vibration of the cover 22 during running of the vehicle becomes bigger than that in the case of no gap between the sealing member 25 and the cover 22 or the housing 10. In view of these facts, the in-vehicle device 4 further includes a degradation determiner 34, which is described below, to determine whether any degradation occurs in the sealing members 25 on the basis of the mechanical vibration measured by the individual first vibration sensors 24 while the covers 22 are closed. The in-vehicle device 4 can therefore determine whether any degradation occurs in the sealing members 25.

The individual components of the in-vehicle device 4 are described in detail below.

As illustrated in FIG. 18, the side surface of the housing 10 is provided with three openings 10d. These openings 10d allow for maintenance of the electronic equipment 71 accommodated in the housing 10. The three openings 10d have the same size and are arranged in the X-axis direction.

As illustrated in FIGS. 17 and 18, the covers 22 are disposed over the respective openings 10d and the circumferences of the respective openings 10d. Each of the covers 22 has an outer surface 22a that faces the outside of the housing 10, and the outer surface 22a is provided with an engaging member 22b fixed with fastening members. The engaging member 22b has a through hole, like the engaging member 11b. The engaging member 22b engages with the support member 23 while the support member 23 is inserted in the through hole of the engaging member 22b. The engaging member 22b is rotatable about the rotational axis AX1 while the support member 23 is inserted in the through hole. The covers 22 are thus supported by the respective support members 23 so as to be rotatable about the rotational axis AX1, and openable and closable by rotating about the rotational axis AX1.

Each of the covers 22 has an inner surface 22c that faces the inside of the housing 10, and the inner surface 22c is provided with the first vibration sensor 24. The covers 22 are preferably made of the same material.

Each of the covers 22 is also provided with the two restricting members 22d to restrict movement of the cover 22 while the cover 22 is closed. When the cover 22 is closed, the restricting members 22d can be rotated from the releasing positions to the restricting positions. The restricting members 22d at the restricting positions engage with the housing 10 and thereby restrict movement of the cover 22 while the cover 22 is closed, although the detailed mechanism is not illustrated.

The support members 23 are fixed with fastening members on the surface of the housing 10 provided with the openings 10d, like the support members 12. Specifically, the support members 23 are disposed at positions above the respective openings 10d in the vertical direction. Each of the support members 23 has protrusions extending in a direction away from the housing 10, and each of the protrusions has a notch. The protrusions of the support member 23 are inserted in the through hole of the engaging member 22b and the engaging member 22b engages with the notches of the support member 23, so that the support member 23 supports the corresponding cover 22 such that the cover 22 is rotatable about the rotational axis AX1.

Each of the first vibration sensors 24 has the configuration identical to that of the first vibration sensor 13. The first vibration sensors 24 are mounted on the respective covers 22 and measure mechanical vibrations of the respective covers 22.

The vibration of each of the covers 22 generated during running of the vehicle varies depending on the position in the cover 22. Specifically, the vibration of the cover 11 is bigger at a position more distant from the engaging member 22b supported by the support member 23 and from the restricting members 22d to engage with the housing 10 and thereby restrict movement of the cover 22. Each of the first vibration sensors 24 is thus preferably disposed at a position at least a first distance away from the support member 23 while the cover 22 is closed, as in Embodiment 1. In addition, the first vibration sensor 24 is preferably disposed at a position at least a second distance away from the restricting members 22d. The second distance is defined in view of the parameters, such as the size of the cover 22 and the positions of the restricting members 22d. For example, the second distance is defined to be equal to the half of the length of the cover 22 in the transverse direction.

More preferably, each of the first vibration sensors 24 is mounted on the inner surface 22c of the cover 22 at the position so as to maximize the sum of the distance from the support member 23 and the distance from the restricting members 22d while the cover 22 is closed, among the mountable positions in the inner surface 22c of the cover 22. In the example illustrated in FIG. 17, the first vibration sensor 24 is mounted on the inner surface 22c of the cover 22 at a position in the center in the X-axis direction and in the center in the Z-axis direction.

The first vibration sensors 24 are fed with electric power and transmit measured values to the degradation determiner 34 via a cable, which is not illustrated, as in Embodiment 1. The first vibration sensors 24 are preferably fed with electric power from the electronic equipment 71.

Each of the sealing members 25 has a groove to engage with the edge of each of the openings 10d, as in Embodiment 1. The sealing member 25 is thus attached to the housing 10 while being disposed around the opening 10d. When the covers 22 are closed, the sealing members 25 are held between the housing 10 and the respective covers 22. The sealing members 25 are made of a material resilient to pressure, such as synthetic rubber or resin, for example.

Figure 19:
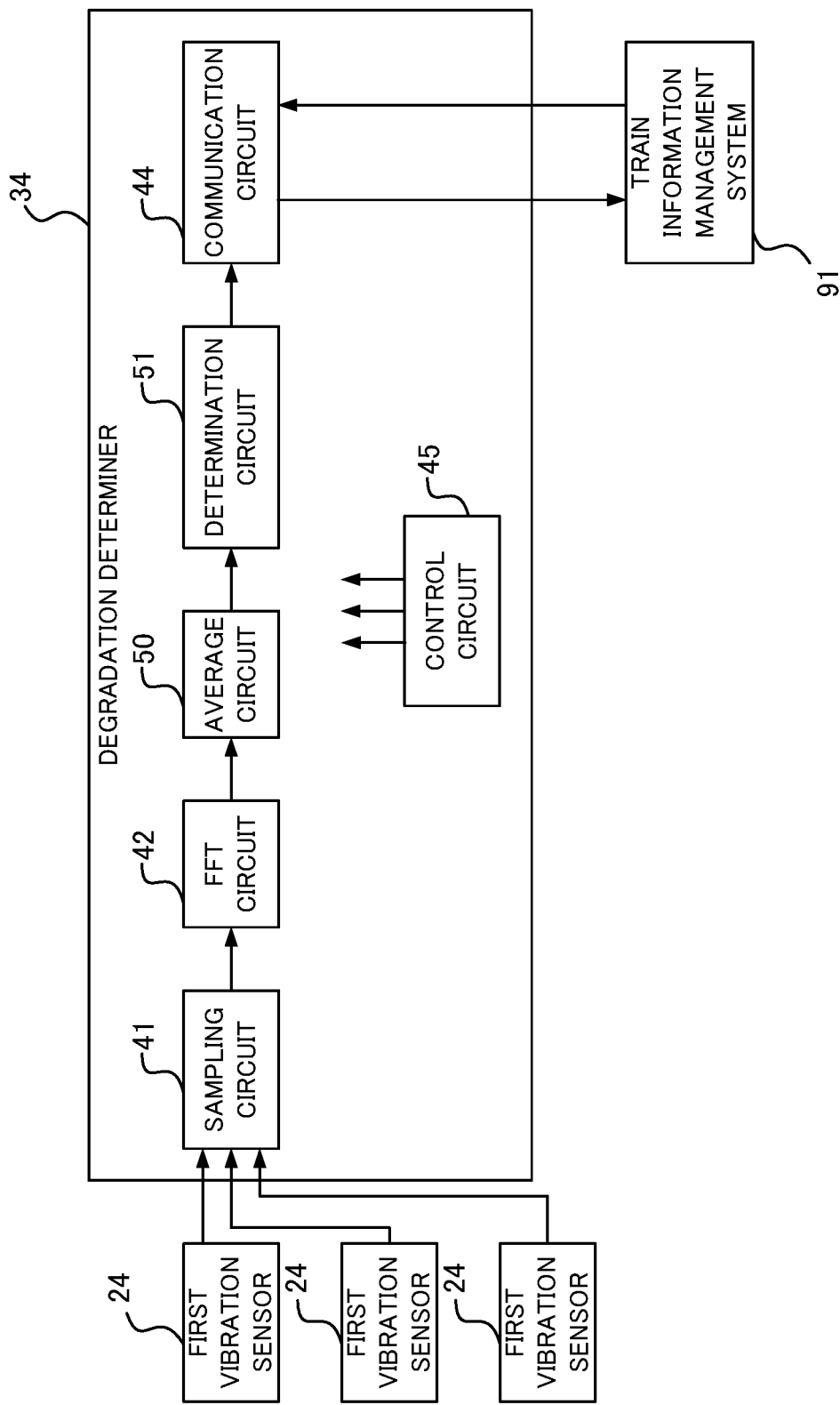
FIG. 19 is a block diagram illustrating a degradation determiner according to Embodiment 4.

The degradation determiner 34 is accommodated in the housing 10, and determines whether any degradation occurs in the sealing members 25 on the basis of the average calculated from the oscillation frequencies of the mechanical vibration of the respective covers 22. In detail, as illustrated in FIG. 19, the degradation determiner 34 includes a sampling circuit 41 to sample the respective values measured by the first vibration sensors 24, an FFT circuit 42 to generate pieces of frequency-domain data from the sampled values measured by the first vibration sensors 24, and an average circuit 50 to calculate oscillation frequencies from the individual pieces of frequency-domain data and calculate the average of the calculated oscillation frequencies, a determination circuit 51 to determine whether the average calculated by the average circuit 50 falls within a predetermined average range, a communication circuit 44 to transmit a result of determination executed by the determination circuit 51 to the train information management system 91, and a control circuit 45 to control the individual components of the degradation determiner 34. The degradation determiner 34 has the hardware configuration identical to that of the degradation determiner 31. The degradation determiner 34 is connected to the individual first vibration sensors 24 and the train information management system 91 via the interface 63.

The individual components of the degradation determiner 34 are described in detail below.

The sampling circuit 41 samples the respective values measured by the first vibration sensors 24 every predetermined sampling period. The sampling circuit 41 then outputs the sampled values measured by the first vibration sensors 24 to the FFT circuit 42.

The FFT circuit 42 executes FFT on the values measured by the first vibration sensors 24 and sampled by the sampling circuit 41, and thereby generates pieces of frequency-domain data. The FFT circuit 42 then outputs the pieces of frequency-domain data to the average circuit 50.

The average circuit 50 calculates an oscillation frequency from the peak value of each of the pieces of frequency-domain data. The average circuit 50 calculates the average of the calculated oscillation frequencies, and outputs the calculated average to the determination circuit 51. For example, the average circuit 50 includes a peak detecting circuit to detect the peak values, an accumulator to accumulate the peak values detected by the peak detecting circuit, and a divider to divide the values accumulated by the accumulator by the number of first vibration sensors 24.

The determination circuit 51 determines whether the average of the oscillation frequencies calculated by the average circuit 50 falls within the predetermined average range. For example, the determination circuit 51 includes a comparator to compare the average calculated by the average circuit 50 with each of the upper limit and the lower limit of the average range. When the average of the oscillation frequencies calculated by the average circuit 50 falls within the average range, this situation can be deemed that no degradation occurs in each of the sealing members 25. In contrast, when the average of the oscillation frequencies calculated by the average circuit 50 does not fall within the average range, this situation implies big vibration of the covers 22 and can be deemed that any degradation occurs in the sealing members 25.

The average range is defined on the basis of possible values of the average of the oscillation frequencies calculated from the respective values measured by the first vibration sensors 24, in the case where the covers 22 are considered to be certainly closed in view of the parameters, such as the air tightness necessary for the in-vehicle device 4, the material of the sealing members 25, and the materials of the housing 10 and the covers 22. In detail, possible values of the oscillation frequencies calculated from the respective values measured by the first vibration sensors 24 in the case where the covers 22 are considered to be certainly closed are calculated on the basis of simulations or test runs, and a value range encompassing the possible values of the average of the oscillation frequencies is applied as the average range.

When the determination circuit 51 determines that the average of the oscillation frequencies does not fall within the average range, the communication circuit 44 transmits a determination result indicating that any degradation occurs in the sealing members 25 to the train information management system 91.

The control circuit 45 controls the initiation, termination, and synchronization of processes of the individual components of the degradation determiner 34, that is, the sampling circuit 41, the FFT circuit 42, the average circuit 50, the determination circuit 51, and the communication circuit 44.

The following description is directed to a degradation determining process executed by the degradation determiner 34 of the in-vehicle device 4 having the above-described configuration.

After the start of running of the vehicle, the degradation determiner 34 initiates the degradation determining process illustrated in FIG. 20. For example, an interlock mechanism is preferably provided to allow a contactor to be closed and electrically connect the electronic equipment 71 accommodated in the housing 10 to the power source only when the covers 22 are closed and fastened. In this case, in response to the closing and fastening of the covers 22 and the closing of the contactor, the electronic equipment 71 is connected to the power source and feeds electric power to the degradation determiner 34. In other words, the degradation determiner 34 is preferably allowed to execute the degradation determining process when the individual covers 22 are closed and fastened.

In order to avoid erroneous determination of occurrence of degradation in the sealing members 25 on the basis of mechanical vibration of the respective covers 22 during acceleration or deceleration of the vehicle, as in Embodiment 1, the degradation determiner 34 preferably determines whether any degradation occurs in the sealing members 25 on the basis of the mechanical vibration measured by the first vibration sensors 24 during coasting of the vehicle. The degradation determiner 34 in Embodiment 4 thus acquires a driving instruction for designating an acceleration of the vehicle from the train information management system 91, and then determines whether the vehicle is coasting on the basis of the driving instruction. When determining that the vehicle is coasting, the degradation determiner 34 determines whether any degradation occurs in the sealing members 25.

The degradation determining process executed by the degradation determiner 34 is described in detail below with reference to FIG. 20.

At the initiation of the degradation determining process, the communication circuit 44 acquires a driving instruction from the train information management system 91 (Step S41). When the driving instruction includes a power running instruction or a braking instruction (Step S42; Yes), the communication circuit 44 repeats Step S41. In contrast, when the driving instruction does not include the power running instruction or the braking instruction (Step S42; No), the sampling circuit 41 acquires measured values from the respective first vibration sensors 24, and samples the respective values measured by the first vibration sensors 24 every sampling period (Step S43).

The FFT circuit 42 executes FFT on the respective values measured by the first vibration sensors 24 and sampled in Step S43, and thereby generates pieces of frequency-domain data (Step S44). The average circuit 50 calculates oscillation frequencies from the respective pieces of frequency-domain data generated in Step S44 (Step S45). The average circuit 50 then calculates the average of the oscillation frequencies calculated in Step S45 (Step S46).

The determination circuit 51 determines whether the average of the oscillation frequencies calculated in Step S46 falls within the predetermined average range. When the average of the oscillation frequencies calculated in Step S46 falls within the average range (Step S47; Yes), the individual components of the degradation determiner 34 repeat the above-described steps from Step S41.

In contrast, when the average calculated in Step S46 does not fall within the average range (Step S47; No), the communication circuit 44 transmits a determination result to the train information management system 91 (Step S48). In detail, the communication circuit 44 transmits a determination result indicating that any degradation occurs in the sealing members 25 to the train information management system 91. After completion of Step S48, the degradation determiner 34 terminates the degradation determining process.

As described above, the degradation determiner 34 included in the in-vehicle device 4 according to Embodiment 4 determines whether any degradation occurs in the sealing members 25 on the basis of the mechanical vibration measured by the first vibration sensors 24 while covers 22 are closed. The degradation determiner 34 determines whether any degradation occurs in the sealing members 25 on the basis of the average of the oscillation frequencies calculated from the sampled values measured by the first vibration sensors 24. This configuration can avoid erroneous determination of occurrence of degradation in the sealing members 25 due to differences in the measurement accuracies between the first vibration sensors 24.

The above-described embodiments are not to be construed as limiting the present disclosure. The above-mentioned hardware configurations and flowcharts are mere examples and may be arbitrarily varied and modified.

The in-vehicle devices 1 to 4 may also be installed in any other vehicle, such as automobile, marine vessel, or aircraft, as well as railway vehicle. The in-vehicle devices 1 to 4 may also be provided at any other site, such as on the floor or on the roof, as well as under the floor.

The housing 10 may have a shape other than those in the above-described examples. In one example, the openings 10a, 10c, and 10d may also be provided on the upper surface of the housing 10 in the vertical direction. In another example, the opening 10c may be provided on a surface of the housing 10 different from the surface provided with the opening 10a. In another example, the openings 10d may be provided to mutually different surfaces of the housing 10.

The closed covers 11, 16, and 22 may be fastened by any method other than the method in the above-described examples, provided that the method can hold and press the sealing members 14, 19, and 25 between the covers 11, 16, and 22 and the housing 10, with the covers 11, 16, and 22 fastened, respectively.

The engaging members 11b, 16b, and 22b may have any shape other than that in the above-described examples provided that the engaging members 11b, 16b, and 22b can engage with the support members 12, 17, and 23, respectively. The engaging members 11b, 16b, and 22b may be fixed on the covers 11, 16, and 22, respectively, by any method other than the fastening with the fastening members. For example, the engaging members 11b, 16b, and 22b may be fixed on the covers 11, 16, and 22, respectively, with an adhesive or by welding. Alternatively, the engaging members 11b, 16b, and 22b may be formed integrally with the covers 11, 16, and 22, respectively.

The support members 12, 17, and 23 may have any shape other than that in the above-described examples provided that the support members 12, 17, and 23 can support the engaging members 11b, 16b, and 22b, respectively. For example, the support members 12, 17, and 23 may be mounted on the upper surface of the housing 10 in the vertical direction, and may have a shape that supports the engaging members 11b, 16b, and 22b that are mounted on the covers 11, 16, and 22, respectively, disposed over the openings 10a, 10c, and 10d provided to the side surface of the housing 10. Alternatively, the support members 12, 17, and 23 may have structures for respectively supporting the covers 11, 16, and 22 such that the covers 11, 16, and 22 can be opened and closed about a rotational axis extending in the vertical direction.

The numbers and positions of the support members 12, 17, and 23 may be arbitrarily defined in view of the parameters, such as sizes, materials, and weights of the covers 11, 16, and 22.

The support members 12, 17, and 23 may be fixed on the housing 10 by any method other than the fastening with the fastening members. For example, the support members 12, 17, and 23 may be fixed on the housing 10 with an adhesive or by welding.

The sealing member 14 may have any shape other than that in the above-described examples, provided that the sealing member 14 can surround the opening 10a such that the sealing member 14 is held between the cover 11 and the housing 10 when the cover 11 is closed. In one example, the sealing member 14 may lack the groove 14a and be bonded to the circumference of the opening 10a of the housing 10 with an adhesive. In another example, the sealing member 14 may be fixed on the cover 11. The same holds true for the sealing members 19 and 25.

The first vibration sensors 13, 18, and 24 and the second vibration sensor 20 may be fed with electric power from the electronic equipment 71 accommodated in the housing 10 as in Embodiments 1 to 4, or may include internal power sources.

It is sufficient that each of the in-vehicle devices 1 to 4 includes at least one of the first vibration sensors 13, 18, and 24, and any number of first vibration sensors 13, 18, and 24 may be provided, other than those in the above-described examples. The above-mentioned positions of the first vibration sensors 13, 18, and 24 are mere examples. For example, the cover 11 may be provided with multiple first vibration sensors 13. In this case, the degradation determiner 31 may calculate oscillation frequencies from the respective values measured by the first vibration sensors 13 and determine whether each of the oscillation frequencies falls within the frequency range. Alternatively, the degradation determiner 31 may calculate the average of the respective oscillation frequencies and determine whether the average of the oscillation frequencies falls within the frequency range.

Each of the first vibration sensors 13, 18, and 24 is not necessarily a vibration sensor for measuring an acceleration and may also be a vibration sensor for measuring a speed or displacement. The first vibration sensors 13, 18, and 24 may be provided to the housing 10 to measure mechanical vibration of the covers 11, 16, and 22, respectively. In this case, the first vibration sensors 13, 18, and 24 may be a non-contact-type vibration sensor.

The above-described number and position of the second vibration sensor 20 is a mere example. For example, multiple inner surfaces of the housing 10 may each have a second vibration sensor 20. In this case, the degradation determiner 33 may determine whether any degradation occurs in the sealing member 14, on the basis of the difference between the average of the respective maximum values of the values measured by the second vibration sensors 20 and the maximum value of the values measured by the first vibration sensor 13.

The second vibration sensor 20 is not necessarily a vibration sensor for measuring an acceleration and may be a vibration sensor for measuring a speed or displacement. The second vibration sensor 20 may be disposed at a position distant from the inner surface of the housing 10. In this case, the second vibration sensor 20 may be a non-contact-type vibration sensor.

The restricting members 22d may have any shape other than that in the above-described example, provided that the restricting members 22d can restrict movement of the covers 22 while the covers 22 are closed.

The degradation determiners 31, 32, 33, and 34 may be achieved as one of the functions of the electronic equipment 71. For example, the degradation determiners 31, 32, 33, and 34 may be equipped as one of the functions of the power conversion apparatus, which is the electronic equipment 71.

Alternatively, the degradation determiners 31, 32, 33, and 34 may be provided outside the housing 10. In one example, the degradation determiners 31, 32, 33, and 34 may be achieved as one of the functions of the train information management system 91. In another example, the degradation determiners 31, 32, 33, and 34 are not necessarily installed in the vehicle including the in-vehicle devices 1 to 4. In this case, the degradation determiners 31, 32, 33, and 34 may acquire measured values from the first vibration sensors 13, 18, and 24 and the second vibration sensor 20 via any network.

The degradation determiners 31, 32, 33, and 34 may cause determination results to be stored into a memory, which is not illustrated, without transmitting the determination results to the train information management system 91. In this case, a maintenance terminal may access the memory and read the determination results during maintenance.

The above-described processes executed by the degradation determiners 31, 32, 33, and 34 are mere examples.

In one example, the degradation determiners 31, 32, 33, and 34 may repeat the degradation determining process without acquiring a driving instruction or environmental information. Specifically, the degradation determiner 31 may skip Steps S11 and S12 in FIG. 7 and execute Step S13 and the following steps. Also, the degradation determiner 32 may skip Steps S21 to S23 in FIG. 12 and execute Step S24 and the following steps. Also, the degradation determiner 33 may skip Steps S31 and S32 in FIG. 16 and execute Step S33 and the following steps. Also, the degradation determiner 34 may skip Steps S41 and S42 in FIG. 20 and execute Step S43 and the following steps.

Steps S21 and S22 in FIG. 12 may be executed in parallel, or Step S22 may be followed by Step S21.

In another example, the degradation determiner 31 may determine that any degradation occurs in the sealing member 14, when the number of times that the oscillation frequency deviates from the frequency range is larger than a predetermined number of times within a predetermined determination period. The determination period can be any period that is long enough not to mistake a sudden variation in the mechanical vibration of the cover 11 as occurrence of degradation in the sealing member 14.

In another example, the degradation determiner 32 may determine whether any degradation occurs in the sealing member 19 only when the vehicle is standing still. In this case, the degradation determiner 32 does not have to acquire a driving instruction from the train information management system 91.

The degradation determining processes executed by the degradation determiners 31, 32, 33, and 34 may be arbitrarily combined with each other.

In one example, the degradation determiner 31 may acquire a driving instruction and pieces of environmental information, and execute Step S13 in FIG. 7 when the driving instruction does not include the power running instruction or the braking instruction and when the environmental conditions defined for the respective pieces of environmental information are satisfied.

In another example, the degradation determiner 32 may acquire a driving instruction, the speed of the vehicle, and pieces of environmental information, and execute Step S24 in FIG. 12 when the driving instruction does not include the power running instruction or the braking instruction or when the vehicle is standing still and when the environmental conditions defined for the respective pieces of environmental information are satisfied.

In another example, the degradation determiner 33 may acquire a driving instruction and pieces of environmental information, and execute Step S33 in FIG. 16 when the driving instruction does not include the power running instruction or the braking instruction and when the environmental conditions defined for the respective pieces of environmental information are satisfied.

In another example, the degradation determiner 34 may acquire a driving instruction and pieces of environmental information, and execute Step S43 in FIG. 20 when the driving instruction does not include the power running instruction or the braking instruction and when the environmental conditions defined for the respective pieces of environmental information are satisfied.

In another example, the degradation determiners 32, 33, and 34 may execute the degradation determining process on the basis of oscillation frequencies, like the degradation determiner 31. For example, the degradation determiner 32 may determine whether the oscillation frequency calculated from the value measured by the first vibration sensor 18 falls within a frequency range.

For example, the degradation determiner 33 may determine whether the difference between the oscillation frequency calculated from the value measured by the first vibration sensor 13 and the oscillation frequency calculated from the value measured by the second vibration sensor 20 falls within a difference range. In this case, the difference range may be defined on the basis of possible values of the oscillation frequency of the mechanical vibration of the cover 11 and possible values of the oscillation frequency of the mechanical vibration of the housing 10.

For example, the degradation determiner 34 may determine whether the average of the respective maximum values of the values measured by the first vibration sensors 24 within a unit time falls within an average range. In this case, the average range may be defined on the basis of possible values of the maximum amplitude of the mechanical vibration of the covers 22.

The sealing members 25 having different shapes or made of different materials are expected to degrade at different rates. In this case, the degradation determiner 34 may determine whether any degradation occurs in the sealing members 25 on the basis of the dispersion of the oscillation frequencies calculated from the respective values measured by the first vibration sensors 24.

Specifically, the degradation determiner 34 may determine whether the difference between the oscillation frequency calculated from the value measured by any one first vibration sensor 24 and the average of the oscillation frequencies calculated from the values measured by another first vibration sensors 24 falls within a difference range. When the difference between the oscillation frequency calculated from the value measured by the one first vibration sensors 24 and the average of the oscillation frequencies calculated from the values measured by another first vibration sensors 24 does not fall within the difference range, this situation can be deemed that any degradation occurs in the sealing member 25 disposed around the opening 10d covered with the cover 22, which is the measurement target of the one of the first vibration sensors 24.

The degradation determiner 32 may determine whether the vehicle is standing still on the basis of information other than the speed of the vehicle. In one example, the degradation determiner 32 may acquire a signal for controlling the opening or closing of doors from the train information management system 91, and execute the degradation determining process when the opening-closing control signal indicates that the doors are open. In another example, the degradation determiner 32 may acquire a pulse signal from a pulse generator mounted on an axle, and execute the degradation determining process when the rotational frequency calculated from the pulse signal can be deemed as 0.

The degradation determiner 31 may determine whether any degradation occurs in the sealing member 14 using a frequency range that varies depending on environmental information. Specifically, the vehicle is more likely to slide and may cause big vibration of the cover 11 in rainy weather in comparison to the vehicle in sunny weather. The degradation determiner 31 may therefore use a broader frequency range in rainy weather than that in sunny weather. Also, the amplitude threshold, the difference range, and the average range may vary depending on environmental information.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3, 4 In-vehicle device
10 Housing
10a, 10c, 10d Opening
10b Edge
11, 16, 22 Cover
11a, 16a, 22a Outer surface
11b, 16b, 22b Engaging member
11c, 16c, 22c Inner surface
12, 17, 23 Support member
13, 18, 24 First vibration sensor
14, 19, 25 Sealing member
14a Groove
15, 21 Cable
20 Second vibration sensor
22d Restricting member
31, 32, 33, 34 Degradation determiner
41 Sampling circuit
42 FFT circuit
43, 49, 51 Determination circuit
44 Communication circuit
45 Control circuit
46 Comparison circuit
47 Counter circuit
48 Difference circuit
50 Average circuit
60 Bus
61 Processor
62 Memory
63 Interface 71 Electronic equipment
91 Train information management system
AX1, AX2 Rotational axis

The invention claimed is:

1. An in-vehicle device installable in a vehicle, the device comprising:
   a housing having an opening;
   a cover that is disposed over the opening and openable and closable;
   a sealing member disposed around the opening such that the sealing member is held between the housing and the cover when the cover is closed;
   at least one first vibration sensor to measure mechanical vibration of the cover; and
   degradation determining circuitry to determine, based on the mechanical vibration measured by the at least one first vibration sensor while the cover is closed, whether any degradation occurs in the sealing member.

2. The in-vehicle device according to claim 1, wherein, in a case where the vehicle is coasting, the degradation determining circuitry determines whether any degradation occurs in the sealing member.

3. The in-vehicle device according to claim 2, wherein the degradation determining circuitry acquires a driving instruction for designating an acceleration of the vehicle and determines, based on the driving instruction, whether the vehicle is coasting.

4. The in-vehicle device according to claim 1, wherein, in a case where the vehicle is standing still, the degradation determining circuitry determines whether any degradation occurs in the sealing member.

5. The in-vehicle device according to claim 1, wherein the degradation determining circuitry determines, based on an oscillation frequency of the mechanical vibration measured by the at least one first vibration sensor, whether any degradation occurs in the sealing member.

6. The in-vehicle device according to claim 1, wherein the degradation determining circuitry determines, based on an amplitude of the mechanical vibration measured by the at least one first vibration sensor, whether any degradation occurs in the sealing member.

7. The in-vehicle device according to claim 1, wherein
   the at least one first vibration sensor comprises a plurality of the first vibration sensors, and
   the degradation determining circuitry determines, based on an average calculated from oscillation frequencies of mechanical vibration measured by the plurality of respective first vibration sensors, whether any degradation occurs in the sealing member.

8. The in-vehicle device according to claim 1, wherein
   the at least one first vibration sensor comprises a plurality of the first vibration sensors, and
   the degradation determining circuitry determines, based on an average calculated from maximum amplitudes of mechanical vibration measured by the plurality of respective first vibration sensors, whether any degradation occurs in the sealing member.

9. The in-vehicle device according to claim 1, wherein the at least one first vibration sensor is mounted on an inner surface of the cover.

10. The in-vehicle device according to claim 1, further comprising a support member to support the cover, wherein the at least one first vibration sensor is disposed at a position at least a first distance away from the support member when the cover is closed.

11. The in-vehicle device according to claim 1, wherein the at least one first vibration sensor operates upon reception of electric power fed from electronic equipment accommodated in the housing and measures the mechanical vibration of the cover.

12. The in-vehicle device according to claim 1, further comprising a restricting member to restrict movement of the cover while the cover is closed, wherein
   the at least one first vibration sensor is disposed at a position at least a second distance away from the restricting member when the cover is closed.

13. The in-vehicle device according to claim 1, further comprising at least one second vibration sensor to measure mechanical vibration of the housing, wherein
   the degradation determining circuitry determines whether any degradation occurs in the sealing member, based on the mechanical vibration of the cover measured by the at least one first vibration sensor while the cover is closed and the mechanical vibration of the housing measured by the at least one second vibration sensor while the cover is closed.

14. The in-vehicle device according to claim 13, wherein the degradation determining circuitry determines whether any degradation occurs in the sealing member, based on a difference between a maximum amplitude of the mechanical vibration of the cover measured by the at least one first vibration sensor and a maximum amplitude of the mechanical vibration of the housing measured by the at least one second vibration sensor.

15. The in-vehicle device according to claim 13, wherein the at least one second vibration sensor is mounted on an inner surface of the housing.

16. The in-vehicle device according to claim 13, wherein the at least one second vibration sensor operates upon reception of electric power fed from electronic equipment accommodated in the housing and measures the mechanical vibration of the housing.

17. The in-vehicle device according to claim 1, wherein the degradation determining circuitry acquires environmental information including at least one of a place where the vehicle is running, a temperature outside the housing, or weather, and determines whether any degradation occurs in the sealing member when an environmental condition defined for each piece of environmental information is satisfied.

18. A degradation determining method, comprising:
   determining, based on mechanical vibration of a cover, whether any degradation occurs in a sealing member, the cover being disposed over an opening of a housing included in an in-vehicle device installed in a vehicle, the sealing member being disposed around the opening such that the sealing member is held between the housing and the cover when the cover is closed.

* * * * *